(12) United States Patent
Chaboud et al.

(10) Patent No.: US 12,062,911 B1
(45) Date of Patent: Aug. 13, 2024

(54) DEVICE DETECTION AND DEVICE OPERATION SENSOR

(71) Applicant: Amazon Technologies, Inc., Seattle, WA (US)

(72) Inventors: Matthew L. Chaboud, San Francisco, CA (US); Kenneth Lawrence Staton, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/037,202

(22) Filed: Sep. 29, 2020

(51) Int. Cl.
*H02J 13/00* (2006.01)
*G01R 21/00* (2006.01)

(52) U.S. Cl.
CPC .. *H02J 13/00002* (2020.01); *H02J 13/00001* (2020.01); *G01R 21/00* (2013.01)

(58) Field of Classification Search
None
See application file for complete search history.

(56) References Cited

U.S. PATENT DOCUMENTS

| | | | |
|---|---|---|---|
| 6,700,333 B1 | 3/2004 | Hirshi et al. | |
| 7,959,136 B2 * | 6/2011 | Nordmeyer | H04B 5/48 267/64.27 |
| 8,131,497 B2 | 3/2012 | Steinberg et al. | |
| 8,244,405 B2 | 8/2012 | Kao et al. | |
| 8,423,322 B2 | 4/2013 | Steinberg et al. | |
| 8,498,753 B2 | 7/2013 | Steinberg et al. | |
| 9,146,548 B2 | 9/2015 | Chambers et al. | |
| 10,018,371 B2 | 7/2018 | Steinberg et al. | |
| 10,031,501 B2 * | 7/2018 | Chapman | G05B 19/0428 |
| 10,107,855 B1 * | 10/2018 | Corbett | G01R 31/2851 |
| 10,306,705 B2 | 5/2019 | Shanmugam et al. | |
| 10,373,234 B2 | 8/2019 | Depew | |
| 11,126,244 B1 * | 9/2021 | Whitehouse | H04B 3/54 |
| 11,133,817 B1 * | 9/2021 | Boettcher | G06F 9/3844 |
| 2006/0075249 A1 * | 4/2006 | Hayes | G07F 7/12 713/179 |
| 2006/0151529 A1 | 7/2006 | Crisp | |

(Continued)

FOREIGN PATENT DOCUMENTS

WO  2010103332 A1  9/2010

OTHER PUBLICATIONS

Blackford, J., "The Future of Computing: For 500,000 Years Technology has Advanced While People Remained the Same. In the next Millennium, the Human Race Plays Catch-Up," Computer Shopper, 19(12) 319, retrieved from https://dialog.proquest.com/professional/docview/668855858?accountid=142257, 1999.

(Continued)

*Primary Examiner* — Tan T. Nguyen
(74) *Attorney, Agent, or Firm* — Athorus, PLLC

(57) ABSTRACT

Described are systems, methods, and apparatus that monitor potential voltage and/or radiated electromagnetic energy at a premises to determine device usage at the premises. The monitored potential voltage and/or radiated electromagnetic energy may be processed to generate voltage signature data and radiated electromagnetic energy signature data, a signature data pair, of an operational device and that signature data pair may be used to identify at least one of a device type, a device, a device element of the device, and/or an operational state of a device.

22 Claims, 19 Drawing Sheets

(56) References Cited

U.S. PATENT DOCUMENTS

| | | |
|---|---|---|
| 2006/0227026 A1 | 10/2006 | Kadota |
| 2007/0038402 A1* | 2/2007 | Zhang .................. H05K 9/00 |
| | | 702/117 |
| 2007/0057680 A1 | 3/2007 | Jones et al. |
| 2009/0222148 A1 | 9/2009 | Knotts et al. |
| 2009/0230950 A1 | 9/2009 | Czarnecki |
| 2010/0079132 A1 | 4/2010 | Steele et al. |
| 2010/0164768 A1 | 7/2010 | Mitikiri et al. |
| 2012/0271576 A1* | 10/2012 | Kamel ................ G01D 4/002 |
| | | 702/62 |
| 2012/0302092 A1 | 11/2012 | Kaps et al. |
| 2013/0041605 A1 | 2/2013 | Ting et al. |
| 2013/0127248 A1 | 5/2013 | Lai |
| 2013/0132008 A1* | 5/2013 | Borean ................ G01D 4/00 |
| | | 702/60 |
| 2013/0254151 A1 | 9/2013 | Mohagheghi et al. |
| 2013/0275066 A1 | 10/2013 | Spanier et al. |
| 2014/0136348 A1 | 5/2014 | Carroll et al. |
| 2014/0177737 A1 | 6/2014 | Vasquez et al. |
| 2014/0225603 A1 | 8/2014 | Auguste et al. |
| 2014/0333322 A1 | 11/2014 | Kabler et al. |
| 2014/0354266 A1 | 12/2014 | Hurwitz et al. |
| 2015/0039391 A1 | 2/2015 | Hershkovitz et al. |
| 2015/0057825 A1* | 2/2015 | Steele ............... G01R 19/2513 |
| | | 700/297 |
| 2015/0077243 A1 | 3/2015 | Hooper et al. |
| 2015/0185262 A1 | 7/2015 | Song et al. |
| 2015/0253364 A1 | 9/2015 | Hieda et al. |
| 2015/0363866 A1 | 12/2015 | Depew |
| 2016/0018447 A1 | 1/2016 | Nys et al. |
| 2016/0047848 A1 | 2/2016 | Chang et al. |
| 2016/0132032 A1* | 5/2016 | Bruneel ............. G05B 19/048 |
| | | 700/295 |
| 2016/0248436 A1 | 8/2016 | Watanabe |
| 2016/0274168 A1 | 9/2016 | Cabot et al. |
| 2016/0285872 A1 | 9/2016 | Polar et al. |
| 2017/0300984 A1 | 10/2017 | Hurwich |
| 2018/0055409 A1 | 3/2018 | Xu |
| 2018/0080970 A1 | 3/2018 | Kraus et al. |
| 2020/0003659 A1 | 1/2020 | Davies et al. |
| 2020/0149981 A1 | 5/2020 | Koeppl et al. |
| 2021/0333310 A1 | 10/2021 | Nag et al. |

OTHER PUBLICATIONS

P3 International, "Kill A Watt," P3 International Corporation, Copyright 2014 http://www.p3international.com/products/p4400.html (downloaded Jun. 27, 2014, byweb.archive.org), 1 page.

Ian, "Dangerous DSO part 3: Messing with the front-end," Dangerous Prototypes, www.dangerousprotoype.com, May 11, 2011; URL: http://dangerousprototypes.com/blog/2011/05/11/dangerous-dso-part-3-messing-with-the-front-end/; retrieved Feb. 23, 2022.

* cited by examiner

DEVICE DETECTION AND DEVICE OPERATION SENSOR

BACKGROUND

People typically use power supplied from power systems, provided using power grids, to light buildings, to heat and cool homes, to enable operation of devices (computers, televisions, kitchen devices, etc.). There is a price for power.

As homes and other premises become more autonomous and more connected, attempts have been made to monitor and/or control the amount of energy consumed by various devices at those premises. However, existing monitoring systems require direct installation into the electrical panel of the premises and/or direct connection to a service main at the premises. In addition, many require dedicated breaker panels for operation.

BRIEF DESCRIPTION OF DRAWINGS

The detailed description is described with reference to the accompanying figures.

DETAILED DESCRIPTION

Figure 1:
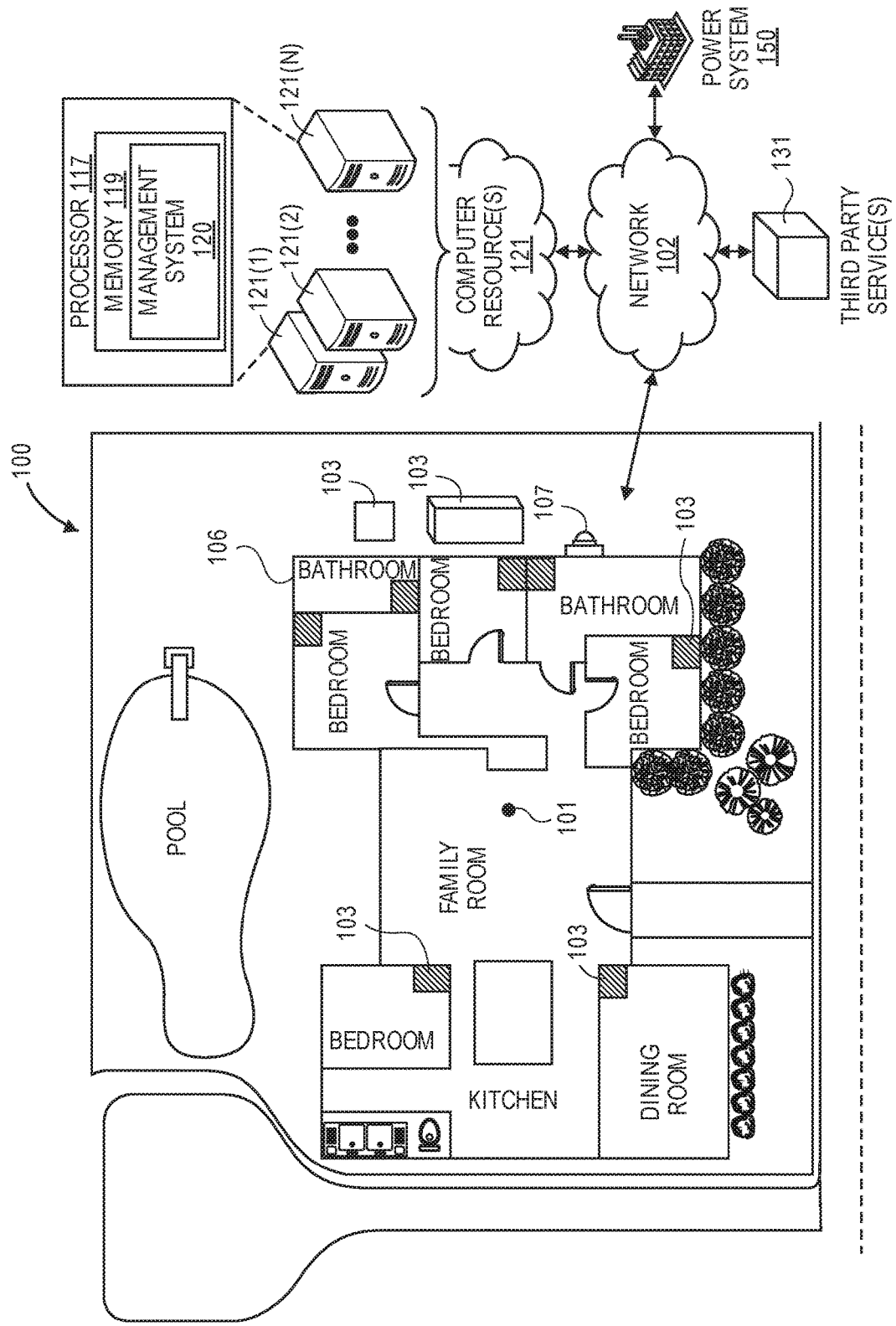
FIG. 1 is a block diagram of a premises for which energy consumption is to be monitored and/or reduced, in accordance with described implementations.

Described are systems, methods, and apparatus that monitor potential voltage and/or changes in radiated electromagnetic energy at a premises to determine device usage at the premises. In comparison to existing systems that require installation into a breaker panel or directly to the mains to measure current, the disclosed implementations utilize a plug-in energy sensor that may be plugged directly into any electrical outlet at the premises and measure deviation in voltage at the premises and/or detect changes in radiated electromagnetic energy at the premises in response to operation or change in state of a device.

Once plugged into an electrical outlet, the plug-in energy sensor may monitor one or more of the hot wire and ground and/or the neutral wire and ground for changes in potential voltage at the premises. For example, when a device at the premises is turned on, the device generates voltage that is introduced into the voltage signal at the premises and detectable by the plug-in energy sensor. Different devices generate different patterns or signatures of voltage as they operate, also referred to herein as voltage signature data, thereby making the voltage signatures unique, or almost unique, to different device types, device elements of a device (e.g., motor, magnetron, heating element, etc.) and/or different devices. For example, the voltage pattern (voltage signature data) introduced by operation of a microwave is very different than the voltage signature of a washing machine. By monitoring for voltage signature data, operation of devices at the premises can be determined, along with start times and stop times of those operations associated with the various devices.

The plug-in energy sensory may also, or alternatively, measure for changes in radiated electromagnetic energy at the premises. When a device is turned on, the device radiates electromagnetic energy that are introduced into the surroundings of the environment as they propagate from the device. Like voltage, different devices cause different changes in the radiated electromagnetic energy at the premises as the devices operate, referred to herein as radiated electromagnetic energy signature data, thereby make the radiated electromagnetic energy signatures unique, or almost unique, to different device types, different device elements of the device, and/or different devices. For example, the changes in radiated electromagnetic energy (radiated electromagnetic energy signature data) that occur in response to operation of a kitchen blender are very different than the changes in radiated electromagnetic energy that occur when a washing machine is operated. By monitoring for radiated electromagnetic energy signature data, operation of devices at the premises can be determined, along with start times and stop times of those operations associated with the various devices.

Still further, in some implementations, the plug-in energy sensor may use both voltage signature data and radiated electromagnetic energy signature data to determine a device, device type, element of a device, stage of device operation, etc. For example, by monitoring for signature data pairs (i.e., both a voltage signature and a radiated electromagnetic energy signature) associated with a device, device detection and operation can be increased as there are multiple different types of signals to search for and to use together to detect a particular device.

For ease of explanation, the term "signature data" as used herein, unless specifically modified with the term "voltage" or "radiated electromagnetic energy," refers to any of voltage signature data, radiated electromagnetic energy signature data, or both voltage signature data and radiated electromagnetic energy data together, which is also referred to herein as signature data pairs.

In some implementations, the signature data, determined device, determined device element, determined device type, or operational state of the device (or the start time and stop time indicating changes in device state) may be compared with energy consumption data for the premises to determine the energy consumed by the device during that state of the device. For example, the energy consumption data between the start time and the stop time of a device state may be processed to determine an increase in energy consumption during that period of time. The increase may then be attributed to the state of operation of the device. In some implementations, the energy consumption data may also be used as an input to assist in determining the device. As discussed below, the energy consumption data may be obtained from the power company, from one or more power meters and/or service equipment at the premises, etc.

In some implementations, information from other devices at the premises may also be used to determine a device and/or the operating state of a device. For example, some devices may communicate with the plug-in energy sensor and/or other devices within the premises and provide information indicating the current state of the device. Likewise, a home control system, such as a communication hub, may control the operation of one or more devices at the premises. In still other examples, sensors, such as light sensors and/or motion sensors at the premises may be used to provide information relating to potential human presence, device operation, identification of persons at the premises, rooms within the premises that are occupied, etc. Information from such devices may be utilized as additional inputs to determine the device state or device states of multiple devices at the premises.

Utilizing voltage monitoring and device identification from a plug-in energy sensor that can be incorporated into the electrical system by simply plugging the plug-in energy sensor into any electrical outlet in conjunction with energy consumption data for the premises provides an improvement over existing energy monitoring systems. For example, the disclosed implementations may be installed by any consumer and do not require professional installation, connection directly to the breaker box and/or electrical mains, and do not consume one or more breaker slots on the breaker box panel. Still further, by monitoring for changes in voltage and/or radiated electromagnetic energy, rather than or in addition to current, additional information and data may be obtained for devices at the premises.

In some implementations, the signature data determined by the plug-in energy sensor, along with the start time and stop time corresponding to each detected voltage signature/radiated electromagnetic energy signature and respective state of the device, is provided to a remote computing system, referred to herein as a management system. The management system maintains premises profiles for each premises, user profiles for users at or associated with the various premises, and may also receive third party data, such as energy consumption information for the premises, weather patterns, power system load, expected energy consumption information for devices, device signals, etc. The premises profiles may identify characteristics about each premises, identification of devices at the premises, signature data for those devices, and/or different states for those devices, the size of a structure at the premises, identification of users that occupy the premises, the orientation of the premises, the altitude of the premises, etc.

In some implementations, the management system may process the signature data to identify the device and/or the device state of a device that generated the signature data. In other implementations, device identification may be done by the plug-in energy sensor. In still other implementations, the plug-in energy sensor may store signature data for previously identified devices at the premises and, if a detected signature data matches one of the stored signature data, the plug-in energy sensor may identify the device and/or the device state of the device. However, if a detected signature data does not match a stored signature data, the detected signature data may be transmitted from the plug-in energy sensor to the remote management system for additional analysis. The remote management system may compare the received signature data with a larger data set of signature data to determine a device type, a device of the device type, an element of the device, and/or a device state of the device. Once identified, the signature data and the device identification and/or device state identification may be provided to the plug-in energy sensor and used in the future by the plug-in energy sensor to identify the device and/or the device state.

In still other examples, the plug-in energy sensor and/or the remote management system may determine whether an identified device is consuming an expected amount of energy, or whether the device may be malfunctioning and/or need servicing—for example, if the device is consuming more energy than expected, if the device is introducing an unexpected voltage or signal on the ground wire at the premises, and/or if the device is emitting an unexpected electromagnetic radiation. Alternatively, or in addition thereto, the actual energy consumed by a device of a device type may be compared with energy consumption of alternative devices of that device type to determine a savings or return on investment that could be realized by replacing an existing device of a device type, with another, more efficient device of that device type.

In still other examples, the plug-in energy sensor and/or the remote management system may determine alternative times during which device operation may be performed at a lower cost, due to, for example, lower energy costs from the power company during those periods of time. In such an example, one or more recommended energy saving actions may be presented to individuals at the premises recommending alternative times at which one or more devices could be operated to reduce the cost of energy consumed at the premises. In other examples, device operation may be autonomously adjusted.

FIG. 1 is a block diagram of a premises 100 for which device detection and energy consumption is to be monitored, in accordance with described implementations. In this example, the premises is a home premises that includes a structure 106 in the form of a personal residence. It will be appreciated that the premises and corresponding structure may be any premises or structure for which energy consumption is to be monitored and/or managed with the described implementations. For example, the premises may be residential, business, commercial, public, etc. Likewise, the structure may be a personal residence, apartment, office building, government building, municipal building, entertainment facility (e.g., coliseum, stadium), shopping facility, etc.

One or more plug-in energy sensors 101 may be positioned at the premises by simply plugging in the plug-in energy sensor into any electrical outlet at the premises 100. In some implementations, two or more plug-in energy sensors 101 may be utilized at the premises, one monitoring each phase of a two-phase power supply at the premises. Likewise, with two plug-in energy sensors 101, approximate device position within the premises can be determined based on the intensity of the radiated electromagnetic energy emitted from the device as measured at each of the plug-in energy sensors 101. In other implementations, only a single plug-in energy sensor may be utilized. Additional details about an example plug-in energy sensor are discussed further below with respect to FIG. 17.

Likewise, each premises includes one or more devices 103 that consume variable amounts of energy based on their usage. The devices 103 may be internal or inside the structure 106, or external or outside the structure 106, and may provide various functions. In some implementations, the devices may be configured to communicate with a communication component to either receive operation instructions and/or to provide usage information.

As discussed herein, upon installation, the plug-in energy sensor monitors for voltage changes and changes in radiated electromagnetic energy at the premises and extracts from a baseline voltage for the premises, detected voltage changes and extracts from the radiated electromagnetic energy, detected changes in the radiated electromagnetic energy. For example, a premises in the United States may receive 120 volts at 60 Hertz ("Hz") frequency, which represents a baseline that is known for the plug-in energy sensor. The plug-in energy sensor may then monitor for voltage changes at the premises by periodically subtracting the baseline from actual voltage measurements at the premises. The remaining voltage is representative of changes at the premises and, over a period of time, the determined voltage changes represent signature data for a device that is operating during that period of time and/or a device state for the device. Likewise, the radiated electromagnetic energy may be monitored and compared on a rolling window to determine changes in the radiated electromagnetic energy over a period of time. As the changes are detected, they are extracted and represent the radiated electromagnetic energy signature data for the device that is operating during that period of time and/or a device state for the device.

The plug-in energy sensor 101, in some implementations, may also introduce a known load, such a resistive load, an inductive load, or a capacitive load, into the existing circuit at the premises and monitor for changes as a result of the introduced load. Load introduction may be performed when the plug-in energy sensor is first connected to the circuit to aid in determining the topology and/or characteristics of the circuit at the premises. Likewise, if there is more than one plug-in energy sensor at the premises, a code may be transmitted by a first plug-in energy sensor that is detectable by the second plug-in energy sensor and utilized to determine if the two plug-in energy sensors are on the same phase of the circuit at the premises. For example, if the code is detected by the second plug-in energy sensor, it may be determined that the two plug-in energy sensors are on the same phase. If the code is not detected, it may be determined that the two plug-in energy sensors are on different phases of the circuit.

Still further, a first plug-in energy sensor may introduce a load into the circuit that is detectable by the second plug-in energy sensor and utilized to determine if the two plug-in energy sensors are on the same branch of the circuit at the premises. For example, if there is little to no attenuation or impedance change between the signal produced in response to the introduced load as measured at the first plug-in energy sensor and measured at the second plug-in energy sensor, it may be determined that both plug-in energy sensors are on the same circuit branch. In comparison, if there is a measurable attenuation or impedance change, it may be determined that the two plug-in energy sensors are on different branches of the electrical circuit at the premises.

If it is determined that both plug-in energy sensors are on the same phase and/or same branch of the circuit, a user may be notified and requested to move one of the plug-in energy sensors to a different room, such as a different electrical outlet at the premises, in an effort to position both plug-in energy sensors on different phases and/or branches of the electrical circuit. By having a plug-in energy sensor on each phase of the circuit and/or on different branches, better detection of devices at the premises may be available in comparison to a single plug-in energy sensor or having multiple plug-in energy sensors on the same phase and/or branch of the circuit.

As signature data is collected by the plug-in energy sensor, the signature data may be used by the plug-in energy sensor to identify a device that generated the signature data and/or to determine the state of the device that generated the signature data. In addition, or as an alternative thereto, the signature data may be provided to the management system 120 via a network 102, such as the Internet.

In still further implementations, the plug-in energy sensor may also monitor for occupancy at the premises. For example, the plug-in energy sensor may monitor a radiated electromagnetic energy by a device at the premises, such as radiated electromagnetic energy emitted from a Wi-Fi access point at the premises. If a human or other animal passes between the plug-in energy sensor and the source of the radiated electromagnetic energy, the radiated electromagnetic energy may be attenuated and that attenuation may be detected by the plug-in energy sensor. Such attenuation of existing radiated electromagnetic energy at the premises may be indicative of a human or other animal occupying the premises.

The premises may also include a power meter 103 that measures the amount of energy consumed at the premises. In some implementations, the power meter 103 may include a wireless component that transmits energy consumption data at periodic intervals and/or that may be polled and, in response to a poll, provide energy consumption data. In such an implementation, the energy consumption data may be obtained locally from the power meter 103 by the plug-in energy sensor and/or by another component at the premises (e.g., communication hub) and used to determine the amount of energy consumed by a device during operation of that device or during a particular operating state of the device.

The system may also include computing resource(s) 121. The computing resource(s) 121 are remote from the premises 100. Likewise, the computing resource(s) 121 may be configured to communicate over a network 102 with the premises 100, the plug-in energy sensor 101, and/or the devices 103. Likewise, the computing resource(s) 121 may communicate over the network 102 with one or more power systems 150, and/or one or more third party service(s) 131.

As illustrated, the computing resource(s) 121 may be implemented as one or more servers 121(1), 121(2), . . . , 121(N) and may, in some instances, form a portion of a network-accessible computing platform implemented as a computing infrastructure of processors, storage, software, data access, and so forth that is maintained and accessible by components/devices of the system via a network 102, such as an intranet (e.g., local area network), the Internet, etc. The computing resources 121 may process signature data received from plug-in energy sensor 101, data from third parties 131 and/or data from the power system 150 to determine devices in operation at the premises and/or energy consumed by those devices when operating at the premises 100.

The server system(s) 121 does not require end-agent knowledge of the physical premises and configuration of the system that delivers the services. Common expressions associated for these remote computing resource(s) 121 include "on-demand computing," "software as a service (SaaS)," "platform computing," "network-accessible platform," "cloud services," "data centers," and so forth. Each of the servers 121(1)-(N) include a processor 117 and memory 119, which may store or otherwise have access to a management system 120, as described herein.

The network 102, and each of the other networks discussed herein, may utilize wired technologies (e.g., wires, USB, fiber optic cable, etc.), wireless technologies (e.g., radio frequency, infrared, NFC, cellular, satellite, Bluetooth, etc.), or other connection technologies. The network 102 is representative of any type of communication network, including data and/or voice network, and may be implemented using wired infrastructure (e.g., cable, CAT5, fiber optic cable, etc.), a wireless infrastructure (e.g., radio frequency, cellular, microwave, satellite, Bluetooth, etc.), and/or other connection technologies.

Figure 2:
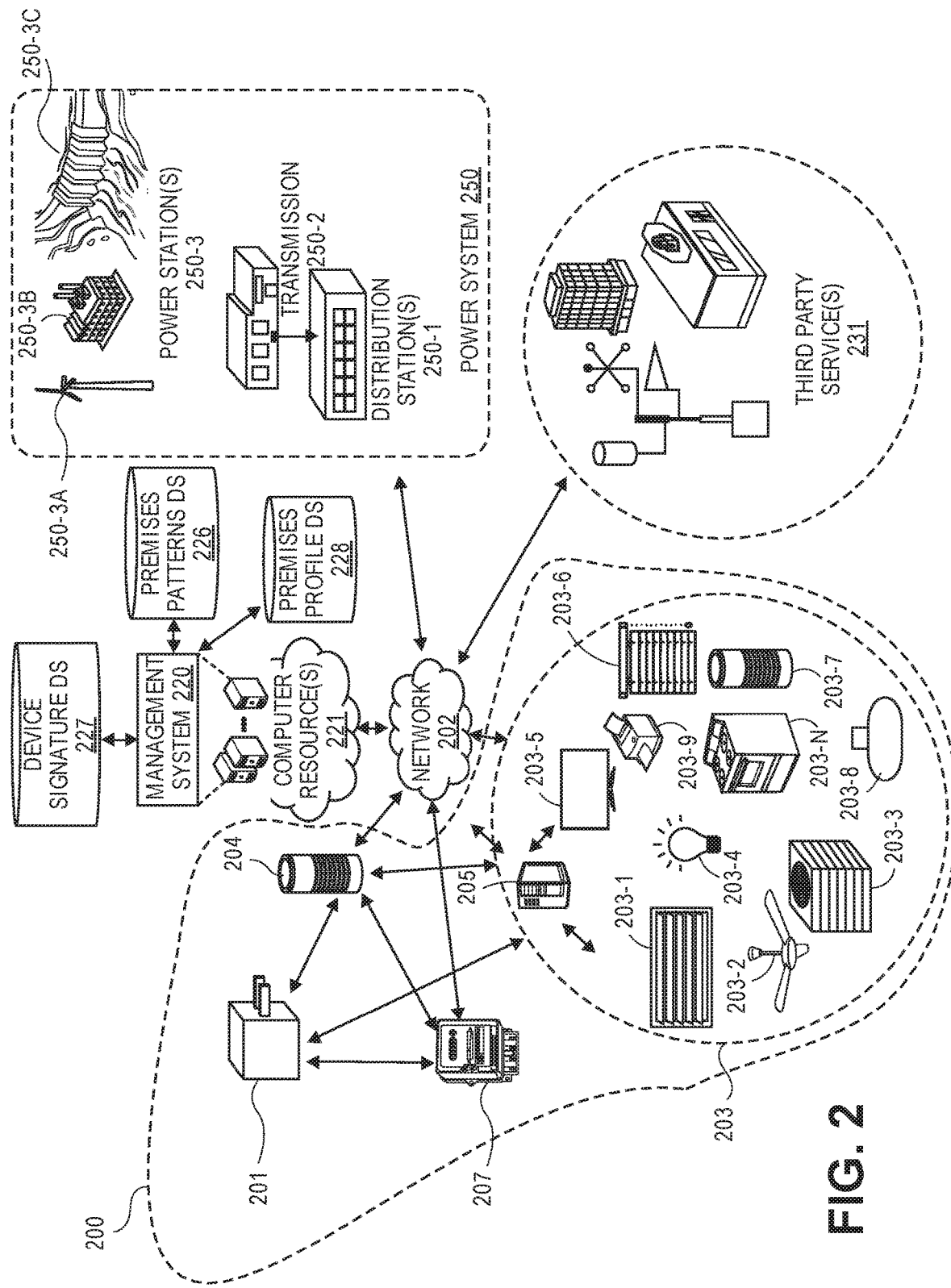
FIG. 2 illustrates a plug-in energy sensor and devices of the premises illustrated in FIG. 1 and the communication paths with remote systems and services, in accordance with described implementations.

FIG. 2 illustrates additional details of a plug-in energy sensor 201, devices 203, third party systems 231, and the power system 250 illustrated in FIG. 1 and the communication paths therebetween, in accordance with described implementations. Example hardware configurations of the plug-in energy sensor 201 are discussed further below with respect to FIG. 17. In some implementations, the plug-in energy sensor 201 may be a stand-alone device that may be plugged into any electrical outlet at the premises. In other examples, the plug-in energy sensor 201 may be incorporated into a device 203 and/or included as part of a communication component 204.

The plug-in energy sensor 201 may by powered by the electrical system at the premises, by battery power, and/or powered from other devices or components. For example, the plug-in energy sensor 201 may harvest power from the electrical outlet into which it is installed. In other implementations, the plug-in energy sensor 201 may not be plugged into an electrical outlet and may operate using battery power.

In addition to collecting signature data (voltage signature data and/or radiated electromagnetic energy signature data), the plug-in energy sensor 201 may be configured to communicate with devices 203, a power meter 207 at the premises, and/or a communication component 204 that is also positioned within the premises. For example, the plug-in energy sensor 201 may include a wireless transmitter/receiver that is operable to connect to a wireless network 202 and provide determined signature data to other devices and/or the communication component via the wireless network. In other implementations, the plug-in energy sensor 201 may be configured to transmit data, such as detected signature data, start time and/or stop time of device state changes, and/or device identifiers, to other components, such as the communication component 204 via the electrical circuit at the premises.

Any form of wired and/or wireless communication may be utilized to facilitate communication between the devices and/or sensors. For example, any one or more of 802.15.4 (ZIGBEE), 802.11 (WI-FI), 802.16 (WiMAX), BLUETOOTH, Z-WAVE, near field communication ("NFC"), etc., may be used to communicate between the devices and one or more sensors.

Devices 203 at a premises may include any one or more items that consume energy during operation. Devices may include, but are not limited to adjustable vents 203-1, ceiling fans 203-2, HVAC 203-3, lights 203-4, televisions 203-5, window blinds 203-6, pool pumps or heaters 203-7, hot water heaters 203-8, office equipment, such as computers or printers 203-9, kitchen appliances 203-N (e.g., microwave, stove, refrigerator, freezer), etc. In addition to consuming energy during operation, even though many devices include shielding, the shielding typically does not contain all of the electromagnetic energy radiated/emitted from the device during operation.

In some implementations, the devices may be connected devices capable of receiving instructions, referred to herein as command data, from the management system 220, via a communication hub 205, via the communication component 204, and/or directly. In other implementations, one or more devices may not be connected and may only be controllable by either a user at the premises and/or by controlling the circuit that provides power to the device.

Connected devices 203 are configured to receive and execute instructions included in command data sent from the management system 220 operating on a remote computing resource directly, via the hub 205 that is positioned at the premises, and/or via the communication component that is positioned at the premises. Likewise, in some implementations, the devices may be further configured to transmit or send operational information (e.g., energy consumption, errors, etc.) to the management system, the plug-in energy sensor, and/or the communication component 204.

In some implementations, the communication hub 205 may forward signature data received from the plug-in energy sensor 201 to the management system for processing by the management system 220 and/or forward command data received from the management system 220 to various devices 203 for execution. In other implementations, some or all of the processing of the signature data may be performed by the communication hub 205. For example, the communication hub 205 may receive signature data from the plug-in energy sensor 201 and compare the received signature data with stored signature data representative of devices and/or device states of devices at the premises to determine the device and/or the device state of a device that was operating and that generated the signature data. In other implementations, the communication hub 205 may receive voltage data from the plug-in energy sensor, process the data to determine the voltage signature data, and then utilize the voltage signature data to determine the operating device and/or the state of the operating device. In still other examples, voltage data and/or radiated electromagnetic energy data may be sent to the remote management system and the remote management system may process the voltage data and/or radiated electromagnetic energy data to determine the voltage signature data, radiated electromagnetic energy signature data, signature data pair, devices, device state, etc.

While the described implementation discusses a communication hub 205 and a communication component 204 as distinct components, in some implementations, the operation and functions described herein may be performed entirely by one or both of the communication hub 205 or the communication component 204. Accordingly, the use of the terms communication hub 205 and communication component 204 may, in some implementations, be utilized interchangeably.

Regardless of whether signature data is determined at the plug-in energy sensor 201, the communication hub 205, the remote computing system 221, and/or some combination thereof, based on the signature data, a device type, a specific device, device element, and/or a device state of a device may be identified. For example, as discussed further below, the plug-in energy sensor 201 and/or the communication hub 205 at the premises may maintain in a memory, stored signature data (voltage signature data, radiated electromagnetic energy signature data, or signature data pairs) corresponding to devices, device types, device element(s), and/or device states of devices known to be at the premises. When signature data is detected by the plug-in energy sensor 201, the plug-in energy sensor and/or communication hub may compare the detected signature data with the stored signature data to determine if the detected signature data corresponds to a known device, device type, device element, and/or device state of a device known to be at the premises. If a match is found, the plug-in energy sensor may transmit to the communication hub 205 and/or the remote management system 220, a device identifier for the device, device type, device element, and/or a device state identifier for a state of the device, along with a start time and a stop time of the device state, indicating a start and stop or change in state of the device 203, as determined from the detected signature. Device state may be any state or detectable change in a device. A device may have two states (on and off) or multiple states. For example, a microwave may have multiple states, including, standby, on, activation of the rotatable table, energizing of the magnetron, and off.

In comparison, if the detected signature data is not matched with a stored signature data, the detected signature data may be sent to the management system 220 for additional analysis. As will be appreciated, the management system 220 may comprise additional compute capacity as well as additional data storage of additional signature data of other devices. For example, the management system may maintain a device signature data store 227 that includes signature data (voltage signature data, radiated electromagnetic energy signature data, and/or signature data pairs) for a large variety of devices, device types, device elements, and/or device states.

Signature data that are maintained in the device signature data store 227 may be generated or obtained from a variety of sources. For example, device manufacturers may provide signature data for devices and/or device states of devices. In other implementations, as devices and/or device states are identified at different premises, the detected device signature data may be aggregated, combined, or added to the device signature data store and used in determining other devices and/or device states at other premises. For example, there may be some signature variation between multiple instances of the same type of device or the same device state of multiple devices of the same device type. As the devices and/or device states are determined at premises, the range of that variation may be updated and used in detecting other instances of that device and/or device state. Accordingly, as additional devices, device states, and/or instances of devices/device states are identified at different premises, the signature data for those devices may be included in the signature data store 227, thereby increasing the management system's 220 ability to identify devices/device states at different premises and to determine if those devices are operating within an expected range, as indicated by the signature data detected for the device or a device state of that device.

When the management system 220 receives signature data it may first compare the signature data with device type signatures to determine a device type (e.g., refrigerator, television, toaster, heater) of the device that generated the signature data. Upon determining a device type, the management system may then compare the signature data with signature data of that device type to determine a match having a highest similarity with the signature data, thereby determining the device and/or the device state of the device. In some implementations, upon determination of the device, device type, and/or device state, the management system may send to the communication hub at the premises, and/or to the plug-in energy sensor, an identification of the newly identified device, device type, and/or device state along with the corresponding signature data. Such information may be added to the stored signature data at the premises and/or added to the premises profile data store 228 that is maintained by the management system 220.

In some implementations, additional information from other devices at the premises may also be utilized by the communication hub 204 and/or the management system 220 to determine the device. For example, information received from one or more connected devices may be used to limit or identify candidate devices that are known to be operating and/or to remove from consideration devices that are known to not be operating. Likewise, sensors at the premises may be used to assist in device determination. For example, a light or motion sensor may provide data indicating whether a person is moving in areas of the premises and/or whether lights are on/off within areas of the premises. As another example, image data and/or other information, such as device identification of a device in the possession of a person, may be used to identify a person at the premises. Such information may be used to expand or reduce the list of candidate devices that may be operating and generating the detected signal.

In addition to determining a device and/or the device state of the device, the management system 220 may also receive from a power system 250, such as a power company, energy consumption information for the premises 200, which the management system may maintain in the usage pattern data store 226 for the premises. The management system may then determine energy consumption by devices operating at the premises by combining the received energy consumption information with the operation information or device state information for devices at the premises. For example, the energy consumption information, may be utilized to determine an increase in energy consumption at the premises between the start time and the stop time corresponding to signature data detected at the premises. This increase in energy consumption between the start time and stop time is indicative of the energy consumed by the device that generated the signature data.

In some implementations, energy consumption data may be obtained at the premises, for example, from a power meter or service meter at the premises. For example, a power meter may include a wireless transmitter and may be configured to provide energy consumption data on a periodic and/or responsive basis. While this information may be generally collected for and by the power company, the information may also be collected by the plug-in energy sensor and/or the communication hub 204 and used to determine the change in energy consumption between the start time and stop time for the identified device.

User acknowledgement or approval may be obtained before energy consumption information and/or information from other devices is collected and used with the described implementations. Likewise, in implementations, user acknowledgement or approval may be obtained before any data is transmitted from the premises to the remote system and/or before any transmitted data is aggregated or used in detecting devices at other premises.

As discussed further below, based on the device/device type, time of operation, and amount of energy consumed by operation of the device, one or more energy saving actions and/or recommendations may be made for the premises and/or the device. For example, the management system 220 may determine if there is another time at which the device may be operated at a lower cost (e.g., night when the cost of energy from the power company is lower). As another example, the management system 220 may determine if the identified device is operating as expected and/or a potential return on investment if the identified device was replaced with another device of the same device type (e.g., a more energy efficient device). Based on these additional analysis, one or more recommendations may be made to operate the device at different times and/or replace the device with a different model.

In some implementations, third party systems 231 may also provide data, such as weather data, device data, expected energy consumption for devices, device signature data, etc., to the management system 220. Third party systems include any type of system or service that is independent of the premises that provides data that may be used by the management system 220 to determine energy saving actions that may be performed by one or more devices at the premises. For example, the third-party system 231 may be a device manufacturer that provides expected energy consumption information for devices and/or signature data for devices. In such an example, the management system 220 may utilize the expected energy consumption information for a device to determine if that specific device is operating as expected and/or whether replacement of an existing device with a different device of the same device type will save energy. Likewise, the signature data for the device may be used to detect operation of the device at a premises, as discussed herein.

The power system 250 may also communicate with the management system 220 and provide, for example, energy consumption information for the premises, demanded power information, or load on the power system, forecasted power demands, costs per unit of power under different operational constraints, etc. For example, the power system 250 may provide information to the management system indicating which power stations are currently operating, the cost per unit of energy produced, and the current load on the power station, also referred to herein as load value. Alternatively, or in addition thereto, energy consumption for a specific premises may be provided by a device at the premises, such as the power meter 207.

A power system 250 typically includes one or more power station(s) 250-3, transmission station(s) 250-2, and distribution station(s) 250-1. Premises, such as premises 200 create demand for power provided by the power system 250 and pay for that power.

Power stations 250-3 may include any form of power generation. For example, a power station 250-3 may be a wind based power station 250-3A, such as a wind farm, a fossil-fuel based power station 250-3B, a hydroelectric power station 250-3C, a solar power station, a nuclear power station, etc. The power system 250 may include any number and type of power stations 250-3.

Electric-power generated by the power stations 250-3 is bulk transmitted at high-voltages via a series of transmission 250-2 lines and stations from the generating power stations 250-3 to distribution stations 250-1. Transmission 250-2 lines and stations when interconnected with each other create transmission networks, which are often referred to as "power grids." The United States has three major power grids, the Western Interconnection, the Eastern Interconnection and the Electric Reliability Council of Texas (ERCOT) grid, often referred to as the Western Grid, the Eastern Grid and the Texas Grid.

The distribution stations 250-1 are located near the premises 200 that create the demand for the power. The distribution stations 250-1 receive the bulk transmissions, step down the voltage and distribute the electricity to end premises 200, such as residential housing, businesses, commercial buildings, etc.

A few of the major constraints with power systems is that power within the system must run at the same frequency and, with only a few exceptions, electrical energy cannot be stored. As such, power must be generated and supplied in real-time at a rate that matches demand. If the demand for power exceeds supply, additional power stations 250-3 must be activated to fulfill the additional demand, or brownouts or blackouts may be experienced at numerous premises that rely upon that power. The distribution stations typically charge the premises for the consumption of energy as a measure of kilowatt-hours (kWh), which is a measure of energy. The rate per kWh generally varies based on the current power demand or load of the power system and/or based on the average or expected power demand on the power system. As the power demand on the power system 250 increases, the cost per unit of energy consumed by each premises likewise typically increases.

The implementations described herein receive the signature data and start/stop times of operation from one or more premises, the third-party data, and data from the power system and process that data to determine energy saving actions that may be performed by devices at the one or more premises.

Figure 3:
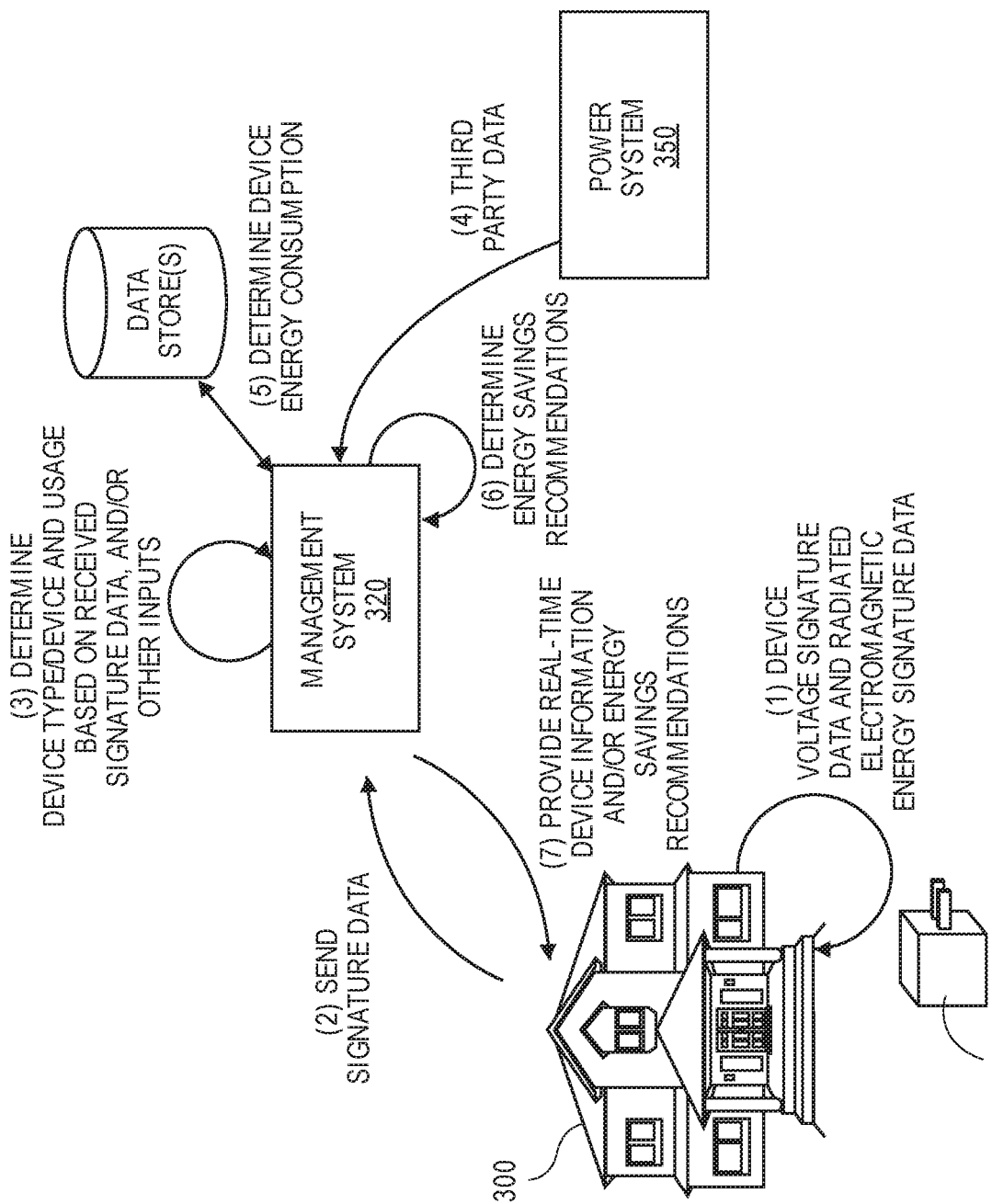
FIG. 3 illustrates an example messaging exchange as part of an energy monitoring and device identification process at a premises, in accordance with described implementations.

For example, FIG. 3 illustrates an example messaging exchange as part of an energy saving and device detection process at a premises 300, in accordance with described implementations. In this example, the plug-in energy sensor 301 monitors for changes in voltage and/or radiated electromagnetic energy at the premises 300. Upon detection of a voltage change and/or radiated electromagnetic energy change, the plug-in energy sensor 301 determines a voltage signature data represented by the change in the voltage and/or radiated electromagnetic energy signature data represented by the change in the radiated electromagnetic energy, and a start time and stop time for operation of a device that is causing the change in the voltage and/or radiated electromagnetic energy at the premises 300.

In this example, the start time, stop time, signature data pairs (voltage signature data and radiated electromagnetic energy signature data) are sent from the premises to the management system 320 for additional processing. At the management system 320, the signature data pair is compared with stored signature data pairs associated with devices, device types and/or device states to determine a device type, a device, device element, and/or a device state that matches the received signature data pair. For example, the signature data pair of voltage signature data and radiated electromagnetic energy signature data of a microwave oven operation, as represented by voltage changes and radiated electromagnetic energy changes, is different than a combination of voltage signature data and radiated electromagnetic energy signature data of a television. In some implementations, the received signature data pair may be first compared to stored signature data pairs for device types to determine a device type of the device. Once the device type is determined, additional comparisons may be performed to determine a device and/or a device state that matches the signature data pair. This additional comparison may be done because different devices of a device type may operate differently, have different device states, and generate different voltage signatures and/or different radiated electromagnetic energy signatures. For example, a microwave from manufacturer A may have a different startup state, and thus a different voltage signature and/or radiated electromagnetic energy signature for a startup state, than a microwave from manufacturer B. Alternatively, or in addition thereto, the received signature data pair may be compared with known signature data pairs for different device elements (e.g., motors, heating elements, etc.) to determine a device element that caused the signature data pair. In such an example, determination of a device element may be used to determine candidate device types based on device types that have or include the determined device element.

In addition to determining the device type, device, device element, and/or device state represented by received signature data, the management system 320 may also determine the amount of energy consumed during the device state of the device. For example, energy consumption information received from a power system, or other third party, may be correlated with the start time and stop time of the signature data and an increase in consumed energy determined for that period of time. That increase in consumed energy for the premises during the period of time is representative of the energy consumed by the device state of the device that generated the signature data.

In some implementations, the device identification and the determined energy consumption from operation of the device may be utilized to determine one or more energy saving actions. As discussed, energy saving actions include but are not limited to, recommending operation of the device at a different time of day, reducing the power requirements of the device, replacing the device with another device of the device type that is more efficient, etc.

Finally, in some implementations, the device, device type, device information, one or more energy saving actions, etc., may be returned to the premises 300 and presented to a user at the premises and/or automatically executed. For example, a recommendation in the form of an energy saving action may be output audibly or visually at the premises using a communication hub, communication component, and/or other device at the premises. Alternatively, or in addition thereto, the energy saving action may be sent to a device at the premises for automatic execution.

Figure 4A:
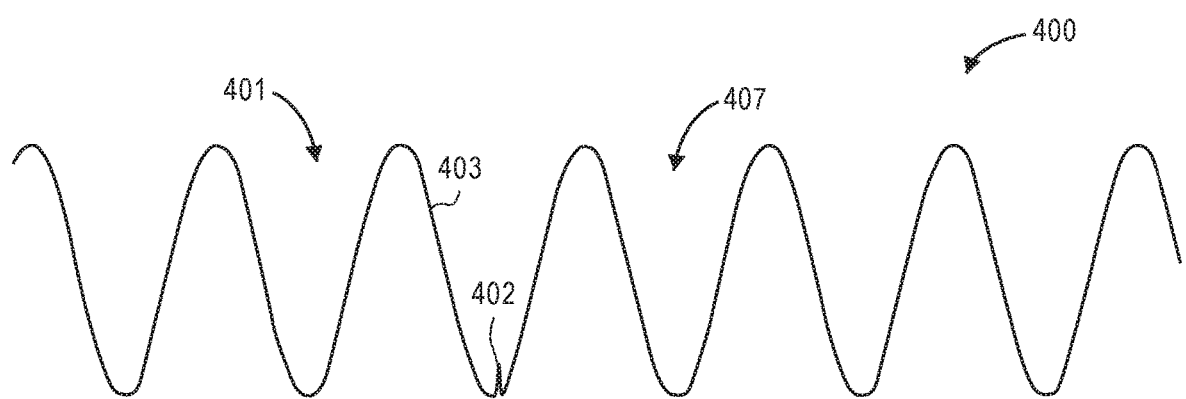
FIG. 4A illustrates an example voltage signal measurement over a period of time on the hot wire of a circuit, in accordance with described implementations.
Figure 4B:
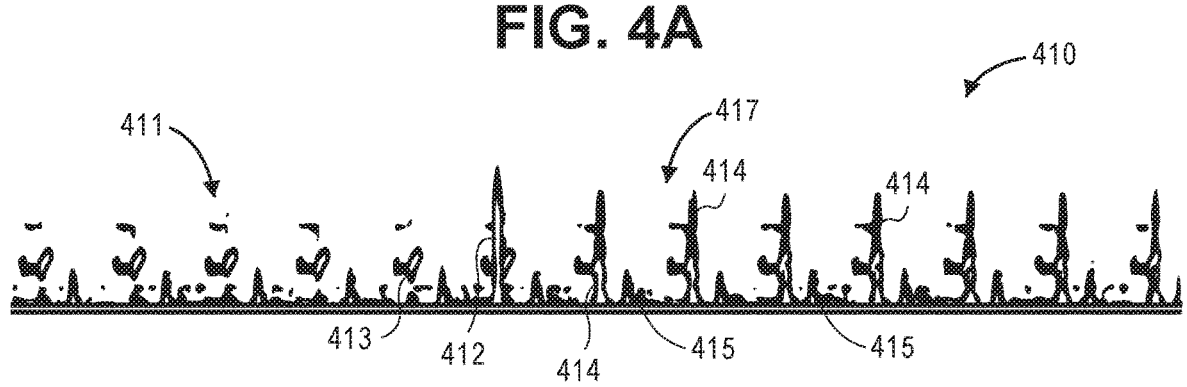
FIG. 4B illustrates an example spectrograph representation of the voltage signal of FIG. 4A, in accordance with described implementations.
Figure 4C:
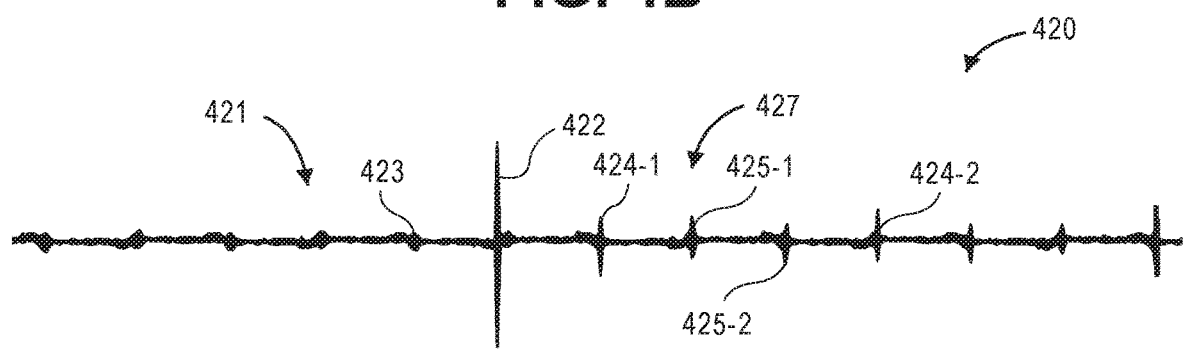
FIG. 4C illustrates an example voltage signal measurement over a period of time on the neutral wire of a circuit, in accordance with described implementations.
Figure 4D:
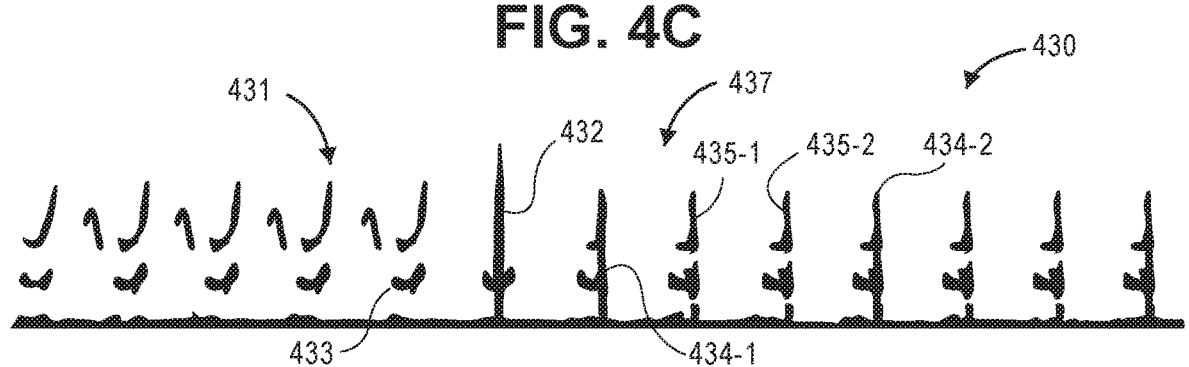
FIG. 4D illustrates an example spectrograph representation of the voltage signal of FIG. 4C, in accordance with described implementations.

FIGS. 4A through 4D illustrate example voltage signatures that may be generated by a device during one or more device states of the device, in accordance with described implementations. In this example, FIG. 4A illustrates an example voltage signal 400 measured over a period of time on the hot wire of a circuit, in accordance with described implementations. FIG. 4B illustrates an example spectrograph representation 410 of the voltage signal of FIG. 4A, in accordance with described implementations. FIG. 4C illustrates an example voltage signal 430 measurement over a period of time on the neutral wire of a circuit, in accordance with described implementations. FIG. 4D illustrates an example spectrograph 440 representation of the voltage measurement of FIG. 4C, in accordance with described implementations. As discussed further below, in some implementations, in addition to or as an alternative to measuring voltage signals on the hot wire and the neutral wire, voltage signals on the ground wire may be monitored and used as an input in determining an identity of an operating device.

As can be seen in each of the voltage signals, during an initial time 401, 411, 421, 431, there are no devices operating and the voltage in this example is 120 volts at a sixty hertz frequency as illustrated by signals 403, 413, 423, 433. When a device, in this example Device A, is activated, an initial voltage increase is introduced into the signal, as represented by the peak 402 in the signal 400, the peak 412 in the spectrograph 410, the peak 422 in the signal 420, and the peak 432 in the spectrograph 430. The device continues to operate as illustrated by the portions 407, 417, 427, and 437 following the initial peak. In addition, the periodic nature of the voltage change may be utilized as the signature data for Device A. For example, looking at the spectrograph 417 of FIG. 4B periodic large peaks 414 and following smaller peaks 415 on the hot wire have a distinct pattern during device operation. In a similar manner, the signal 420 measured on the neutral wire illustrates periodic voltage peaks 424-1, 425-1, 424-2, and 425-2 that are introduced by operation of Device A. In addition, the amplitude of the peaks 424-1, 424-2 are separated by a pattern of two smaller amplitude peaks 425-1, 425-2. This cycle repeats during operation of Device A, thereby providing another portion of the signature data generated by Device A during operation. Finally referring to the spectrograph of the neutral wire signal, the repeating patterns of two peaks 434-1 and 434-2 are separated by smaller peaks 435-1 and 435-2. In some implementations, signals on the ground wire may also be measured by the plug-in-energy sensor. For example, the ground wire with respect to a floating point, such as a smooth version of voltage), may be monitored for noise or voltage introduced to the ground wire during device operation. Monitoring the ground wire may be particularly beneficial in detecting operation of certain electronic devices that utilize a power supply that couples the capacitor bank to the ground wire using a resistor or other coupling. Likewise, ground wire monitoring may aid in the determination of device malfunction as many devices, as they begin to malfunction or lose efficiency, introduce an unexpected voltage on the ground wire.

The different patterns of voltage changes on the measured hot wire, neutral wire, and/or ground wire, as detected by the plug-in energy sensor, collectively provide voltage signature data that is representative of an operation of Device A. As discussed herein, as the voltage signature data is detected, the voltage signature data can be compared to stored voltage signature data to identify Device A.

In addition to monitoring for signals indicating device operation, in some implementations, the plug-in energy sensors may actively model or determine the topology or characteristics of the electrical circuit at the premises to which they are connected. By modeling the electrical circuit, the plug-in energy sensor or the remote management system may determine a baseline signal of the circuit at the premises, determine behavior and responses to different loads when introduced to the circuit, etc. Such information increases the fidelity and accuracy of signal extraction and device detection.

Figure 5A:
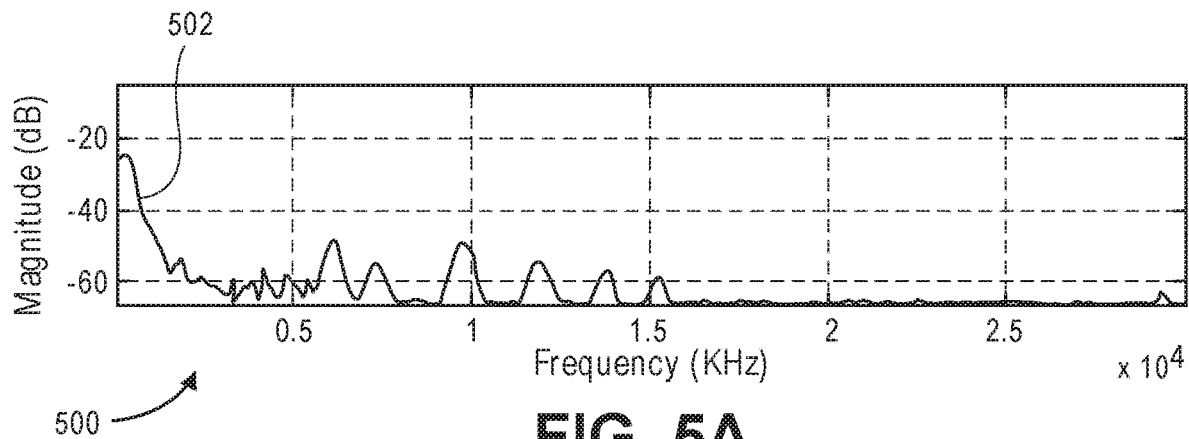
FIG. 5A illustrates a representation of a baseline radiated electromagnetic energy at a first premises, in accordance with described implementations.
Figure 5B:
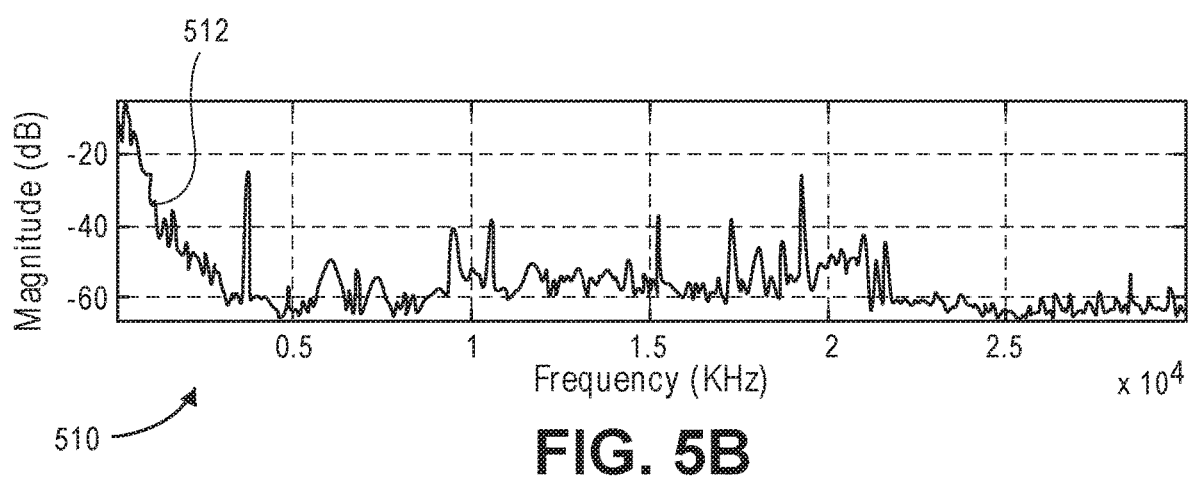
FIG. 5B illustrates a representation of changes in radiated electromagnetic energy at the first premises during startup of a first example device, in accordance with described implementations.
Figure 5C:
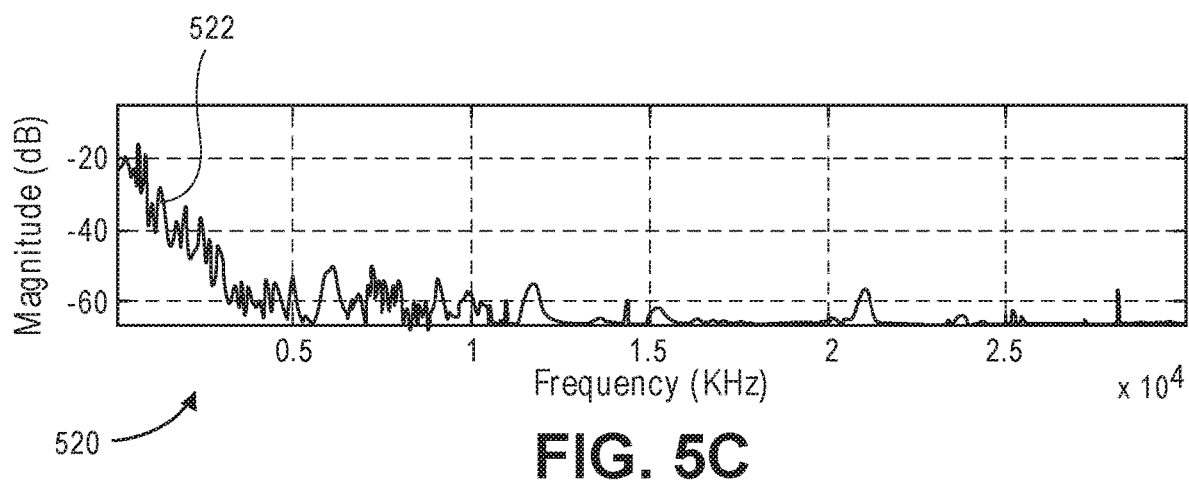
FIG. 5C illustrates a representation of changes in radiated electromagnetic energy at the first premises during steady-state operation of the first example device, in accordance with described implementations.

FIGS. 5A through 5C illustrate example radiated electromagnetic energy measured at a first premises, in accordance with described implementations. FIG. 5A illustrates a graph 500 of an example radiated electromagnetic energy baseline 502 at a first premises, in accordance with described implementations. FIG. 5B illustrates at graph 510 of an example radiated electromagnetic energy 512 measured at the first premises during startup of a first example device, in accordance with described implementations. FIG. 5C illustrates a graph 520 of an example radiated electromagnetic energy 522 measured at the first premises during a steady-state operation of the first example device, in accordance with described implementations.

As illustrated in the graph 500 of FIG. 5A, most of the baseline radiated electromagnetic energy 502 is detected below 1.5 kilohertz ("kHz") and is fairly smooth. In comparison, during startup of the first example device, the measured radiated electromagnetic energy 512 extends beyond 2.5 kHz and has higher energy at more frequencies. The radiated electromagnetic energy signature is distinct. However, even though the electromagnetic energy emitted from the first example device during startup is present in a broad frequency range, that radiated electromagnetic energy may be used as radiated electromagnetic energy signature data representative of the first example device during startup because they are unique. Similarly, as illustrated in FIG. 5C, even during steady state operation of the first example device, the first example device radiates an electromagnetic energy that is mostly detectable below 1.5 kHz, yet still very distinct from the baseline radiated electromagnetic energy 502 (FIG. 5A) present at the premises.

Figure 6:
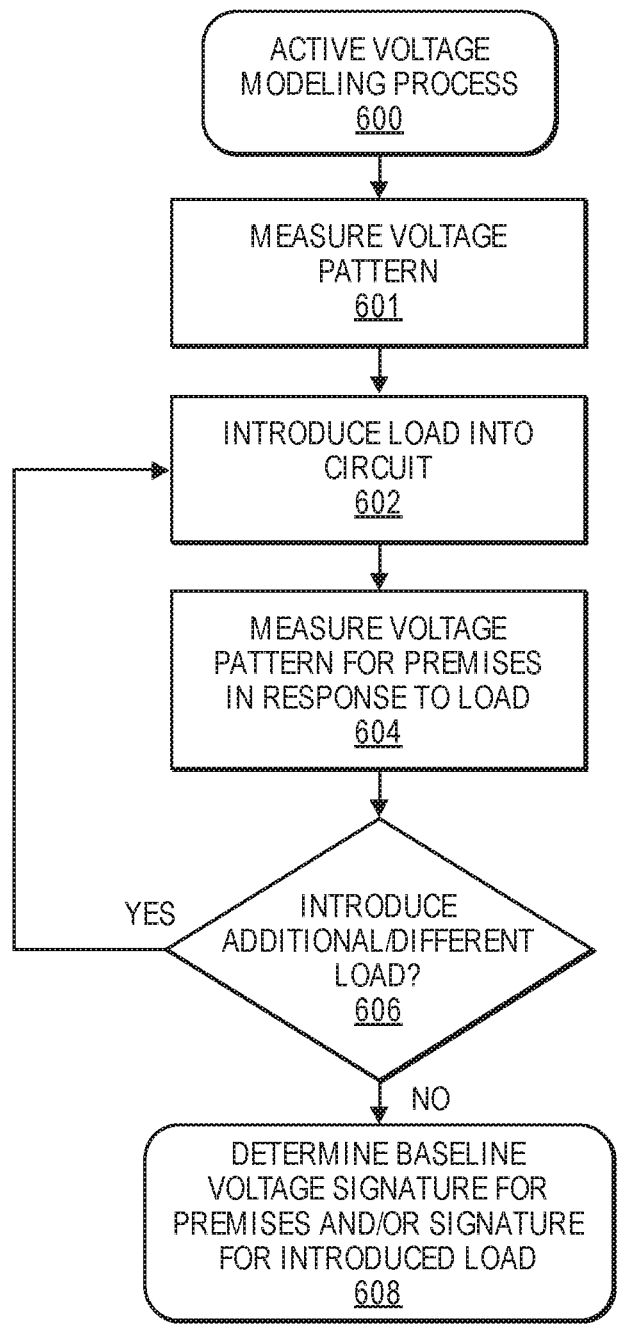
FIG. 6 is an example active voltage modeling process, in accordance with described implementations.

FIG. 6 is an example active voltage modeling process 600, in accordance with described implementations. The example process 600 may be performed when the plug-in energy sensor is first connected to a circuit, when power is detected by the plug-in energy sensor (e.g., after a power outage at the premises), at periodic intervals, etc.

The example process 600 begins by the plug-in energy sensor measuring a voltage pattern present on the electrical circuit to which it is connected, as in 601. As discussed above, the voltage pattern may be measured on any one or more of the hot wire, neutral wire, and/or ground wire.

In addition to measuring the voltage pattern, the example process 600 introduces a load into the circuit to which the plug-in energy sensor is connected, as in 602. Different loads may be introduced at different times to measure the differences of those introduced loads—i.e., the signals produced on the electrical circuit in response to the different introduced loads. As discussed further below, in some implementations, in addition to introducing a load to determine baseline characteristics, introduced loads will produce different measured voltage signals based on what other devices are currently operating. For example, an introduced load will produce a different voltage signal when a washing machine is in a spin cycle compared to when the washing machine is turned off. Introduced loads may be, for example but not limitation, resistive loads, inductive loads, capacitive loads, etc.

As the load is introduced into the circuit, the voltage pattern at the premises is measured between the time the load is in introduced until introduction of the load terminates, as in 604. The duration of load introduction may be any time interval, such as 3 seconds. As discussed, the voltage pattern may be measured on one or more of the hot wire, neutral wire, and/or ground wire and each of those measurements may be used alone or in combination to produce a voltage signal representative of the introduced load produced on the electrical circuit under the current operating conditions of devices on the electrical circuit.

After measuring the voltage pattern produced in response to the introduced load, a determination is made as to whether an additional and/or different load is to be introduced into the circuit by the plug-in energy sensor, as in 606. In some implementations, multiple different loads may be introduced in parallel or in series by the plug-in energy sensor so that the different responses to the different types of loads can be measured.

If it is determined that an additional and/or different load is to be introduced, the example process 600 returns to block 602 and continues. However, if it is determined that no additional and/or different loads are to be introduced, a baseline voltage signature data is determined for the premises and/or a voltage signature data representative of the introduced load at the premises and under the current conditions is determined, as in 608. The baseline voltage may be determined by subtracting out each of the measured signals resulting from the different introduced loads and the remaining signals identified as the baseline signal. This may be done for one or more of the hot wire, neutral wire, and/or ground wire and the baseline signature data may be considered to include one or more of those signatures. Likewise, the voltage signature data for the introduced load may be determined by removing the voltage pattern measured at block 601 before the load was introduced, and producing voltage signature data from the remaining voltage pattern that was produced in response to the introduction of the load into the electrical circuit.

In some implementations, the example process 600 may be performed at different times when it is known that different devices are operating at the premises so that different signature data produced in response to an introduced load can be determined and associated with those devices and/or particular device states of those devices. For example, a resistive load may be periodically introduced into the electrical circuit and the resultant signature data determined at different times when different devices are known to be in different operating states. The resultant signature data may then be associated with those devices and/or device states. At a later time, when device detection is being performed, the resistive load may be introduced into the electrical circuit and the resultant signature data compared to load signature data determined under different device operating conditions/states. Those comparisons may be used as inputs in device identification and detection and/or determination of device state.

Figure 7:
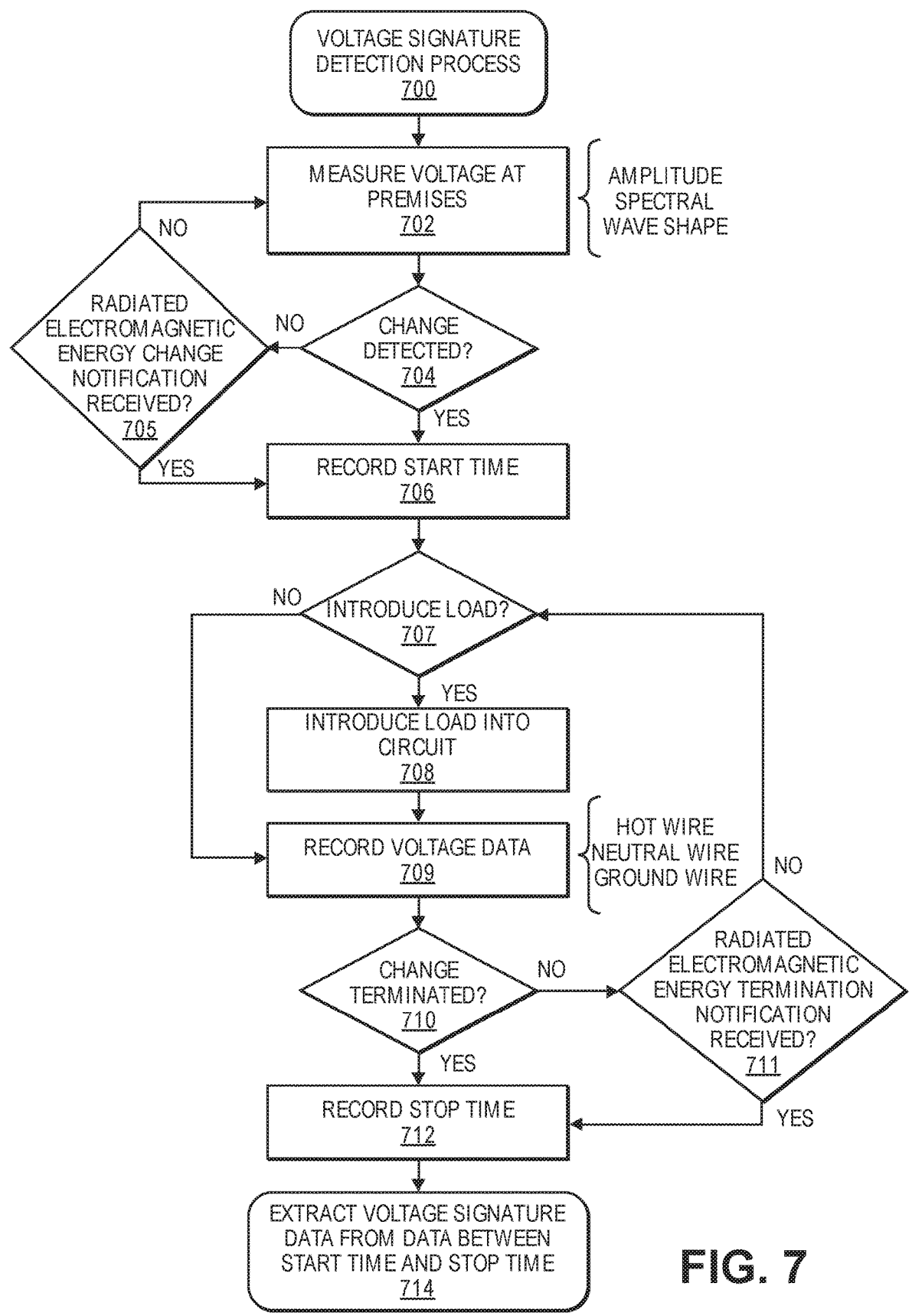
FIG. 7 illustrates an example voltage signature detection process, in accordance with described implementations.

FIG. 7 illustrates an example voltage signature data detection process 700, in accordance with described implementations. The example process begins by monitoring for a voltage change at a premises, as in 702. As discussed above, a known or baseline voltage signature data (e.g., 120 V at 60 Hz) may be known for a premises and monitored for deviations over a period of time. A variety of techniques may be utilized to determine voltage changes including, but not limited to, monitoring for changes in amplitude, spectral changes, and/or waveform or wave shape changes. In some implementations, the voltage changes may be monitored on a time basis to detect changes in the voltage over a period of time (e.g., comparing $T_0$ with $T_1$, etc.). Likewise, the voltage change may be monitored on any one or more of the hot wire with respect to ground, the neutral wire with respect to ground, or the ground wire with respect to a reference, such as a smooth voltage waveform.

As the voltage at the premises is monitored, a determination is made as to whether a change in the voltage is detected, as in 704. If no change is detected, a determination is made as to whether a radiated electromagnetic energy change notification has been received, indicating that a change in the radiated electromagnetic energy has been detected, as in 705. The radiated electromagnetic energy change notification is discussed further below with respect to FIG. 9 and indicates that a change in the radiated electromagnetic energy at the premises has been detected.

If it is determined that a radiated electromagnetic energy change notification has not been received, the example process 700 returns to block 702 and continues. However, if a change is detected at decision block 704 or if a radiated electromagnetic energy change notification is received at decision block 705, a start time of the detected change is recorded, as in 706. A start time may be any identifier or marker indicating a time at which the voltage change at the premises is detected. In some implementations, the plug-in energy sensor may be synchronized with a timing clock, such as a clock signal transmitted over a wireless network at the premises. In such an example, the start time may be a time determined from the clock signal when the voltage change is detected. In some implementations, the start time may be a defined time prior to the detection or change notification (e.g., five seconds)

In some implementations, a determination may also be made as to whether one or more loads are to be introduced into the circuit while the device is operating, as in 707. As discussed above, introducing a known load into the circuit during device operation will produce different resultant voltage signals based on the device and/or the device state of the device, which may aid in identifying the device and/or the device state of the device. For example, a resistive load introduced into the circuit during the spin cycle of a washing machine (a device state) will produce a different resultant voltage signal compared to introduction of the same resistive load during the fill cycle of the washing machine (another device state), or when the washing machine is off (another device state). If it is determined that a load is to be introduced into the circuit during the device operation, the load is selected and introduced into the circuit for a defined period of time (e.g., three seconds), as in 708.

During and subsequent to introduction of the load into the circuit, or if it is determined that no load is to be introduced into the circuit, voltage data from one or more of the hot wire, the neutral wire, and/or the ground wire, is recorded, as in 709. In some implementations, all voltage data may be recorded to memory. In other implementations, the voltage data may be processed as it is received to remove the baseline voltage signature data and/or introduced load voltage signature data, such that only the voltage signature data generated by the change in voltage due to device operation remains, and that change recorded. In still other examples, the voltage data may be periodically sampled and those samples, or the change voltage represented in those samples, recorded. For example, samples of the voltage data may be obtained once per second and introduced load voltage signature data and/or voltage signature data produced by the operation of the device determined from the samples.

As the voltage data is recorded, a determination is made as to whether the change in the voltage has terminated, as in 710. Determining whether the change in voltage has terminated may be done for a period of time before it is confirmed that the change has terminated. For example, some device states may generate voltage signature data in which there is no additional voltage at periodic intervals, e.g., during the open/close of relay switches of the device, but the device is still in the same device state. By confirming that there is no voltage change for a defined period of time, e.g., five seconds, it may be confirmed whether the device has changed device states.

If it is determined that the voltage change has not terminated, the example process 700 returns to block 707 and continues. However, once the device state changes, the voltage change will terminate or change, and the transition will be detected by the example process 700. If it is determined that the voltage data has changed, a determination is made as to whether a radiated electromagnetic energy change termination notification has been received, as in 711. If it is determined than a radiated electromagnetic energy change termination notification has not been received, the example process returns to block 707 and continues. When it is determined that the voltage change has transitioned and/or a radiated electromagnetic energy change termination notification has been received, a stop time indicating the change is recorded, as in 712.

Finally, the recorded voltage data between the start time and the stop time is processed to extract the voltage signature data of the device and/or voltage signature data resultant from introduced loads, as in 714. As discussed, the voltage signature data may be extracted by subtracting out the baseline voltage signature data and this may be done on one or more of the hot wire, the neutral wire, or the ground wire. Additionally, or as an alternative thereto, the voltage signature data resulting from device operation or device state may be determined based on an increase in amplitude of the voltage signal during the period of time, based on a spectral analysis of the recorded data, and/or based on wave shape or waveform analysis of the recorded voltage data. Likewise, the voltage signature data produced from an introduced load may be predictable based on the load that was introduced.

Figure 8:
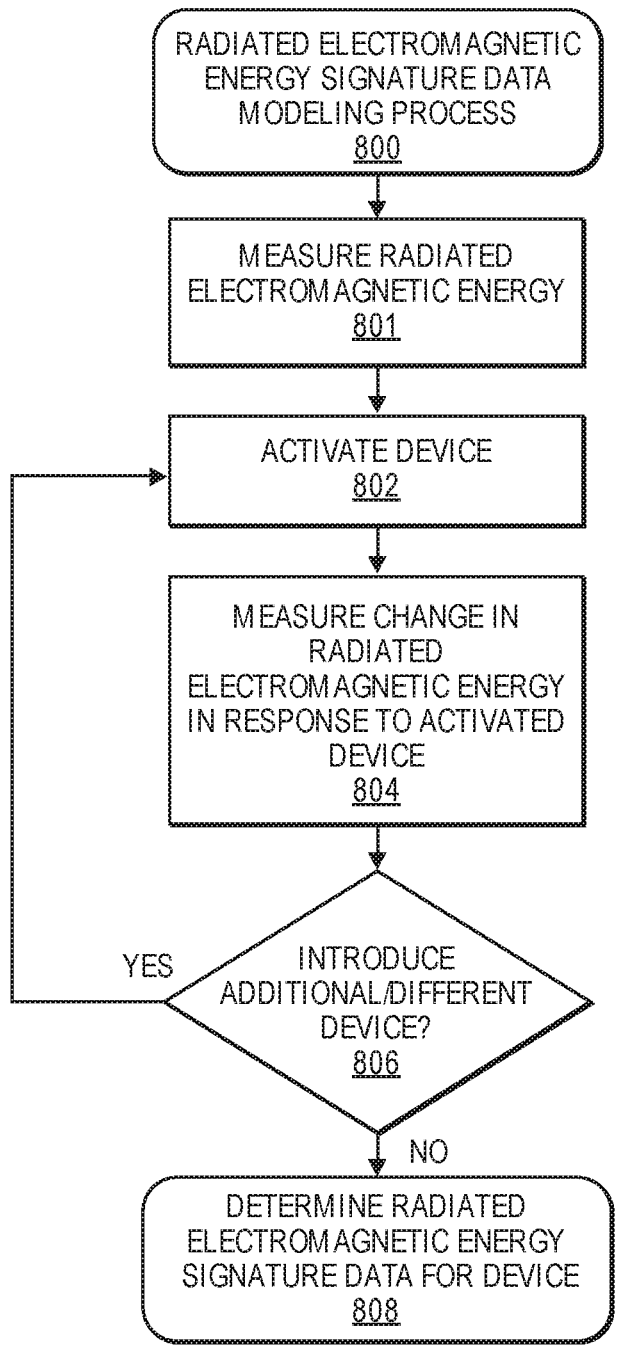
FIG. 8 illustrates an example radiated electromagnetic energy signature data modeling process, in accordance with described implementations.

FIG. 8 is an example radiated electromagnetic energy signature data modeling process 800, in accordance with described implementations. The example process 800 may be performed when the plug-in energy sensor is first connected to a circuit, when power is detected by the plug-in energy sensor (e.g., after a power outage at the premises), when a change in radiated electromagnetic energy is detected by the plug-in energy sensor, as part of a training, at periodic intervals, etc.

The example process 800 begins by the plug-in energy sensor measuring radiated electromagnetic energy at a premises at which the plug-in energy sensor is connected/located, as in 801. As the radiated electromagnetic energy is being measured, a device is activated, as in 802. The plug-in energy sensor then measures a change in the radiated electromagnetic energy for the premises in response to the activated device, as in 804.

In some implementations, a decision may be made as to whether to introduce another device, as in 806. In some implementations, multiple different devices may be activated during the example process 800 so that the combined radiated electromagnetic energy can be compared, measured, and each individual device identified.

If it is determined that additional devices are to be introduced, the example process 800 returns to block 802 and continues. However, if it is determined that no additional devices are to be introduced, the radiated electromagnetic energy signature data for the activated device(s) is determined, as in 808. In some examples, a baseline radiated electromagnetic energy signature for the premises determined at block 801 may be subtracted from the radiated electromagnetic energy measured at block 804, leaving the radiated electromagnetic energy signature data for the activated device. In other implementations, a rolling sample widow, as discussed above, may be used in which a sample of the measured radiated electromagnetic energy at the premises during a first time window is compared with a sample of the radiated electromagnetic energy at the premises during a second time window, such as an adjacent time window. As the sample windows are compared, the differences may be used to generate the radiated electromagnetic energy signature data for the activated device(s).

In some implementations, the example process 800 may be performed at different times when it is known that different devices are operating at the premises so that different radiated electromagnetic energy signature data produced in response to an activated device can be determined and associated with those devices and/or particular device states of those devices. For example, a resistive load device may be periodically activated and the resultant radiated electromagnetic energy signature data determined when it is known that the device is active. The resultant radiated electromagnetic energy signature data may then be associated with the device and/or device states. At a later time, when device detection is being performed and the device is activated, the detected change in radiated electromagnetic energy at the location may be compared with the stored radiated electromagnetic energy signature data to determine the activated device and/or the device state of the device.

Figure 9:
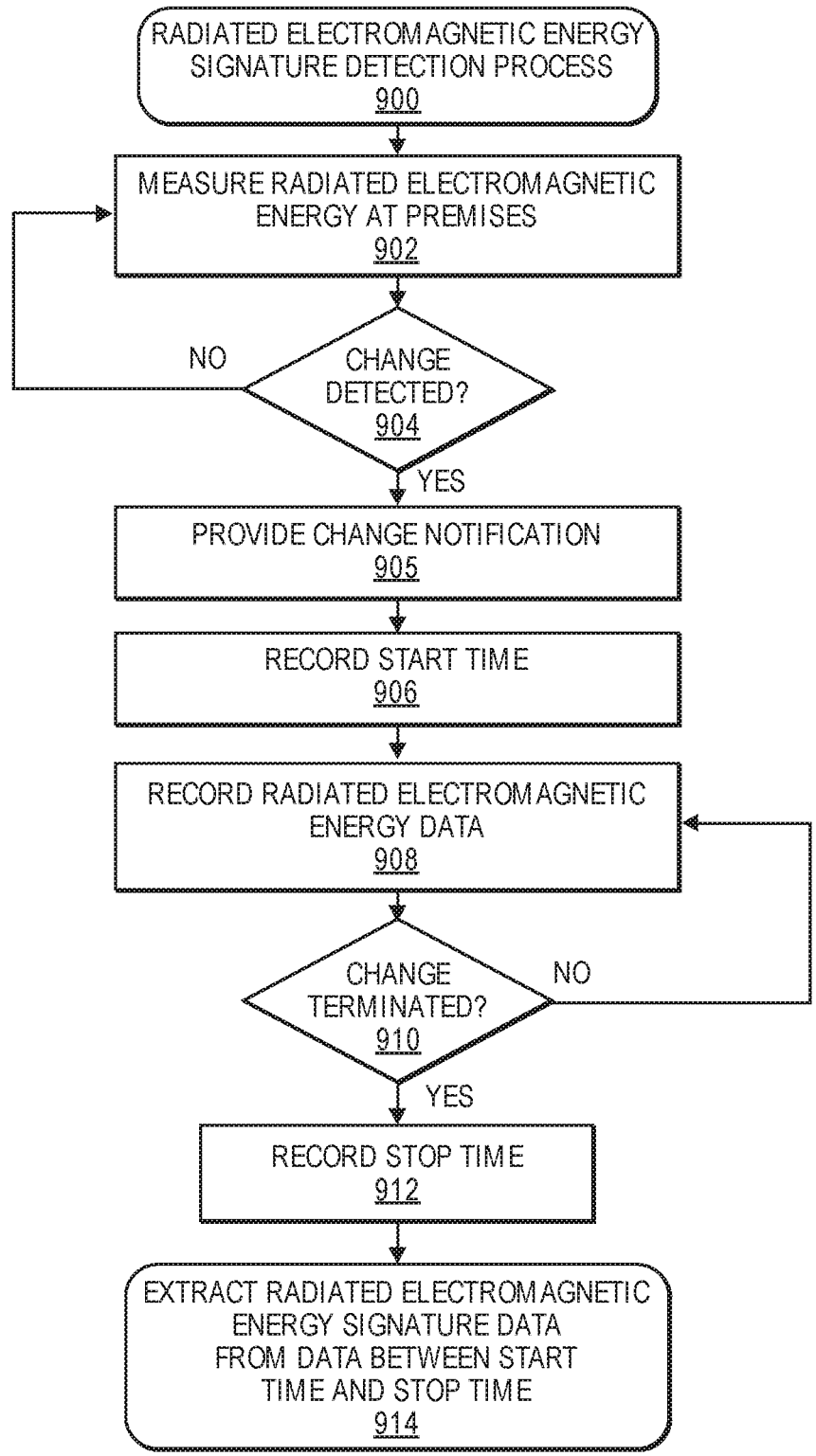
FIG. 9 illustrates an example radiated electromagnetic energy signature detection process, in accordance with described implementations.

FIG. 9 illustrates an example radiated electromagnetic energy signature data detection process 900, in accordance with described implementations. As radiated electromagnetic energy is measured at the premises, as in 902, a determination is made as to whether a change in the radiated electromagnetic energy is detected, as in 904. As discussed above, in some implementations, a baseline radiated electromagnetic energy may be known for the premises and the measured radiated electromagnetic energy compared to the baseline to determine if a change in the radiated electromagnetic energy exists. As another example, also as discussed above, the measured radiated electromagnetic energy may be compared on a rolling window to determine if a change has been detected.

If no change is detected, the example process 900 returns to block 902 and continues. However, if a change is detected, a change notification is generated, as in block 905, and a start time of the detected change is recorded, as in 906. As discussed above, the radiated electromagnetic energy change notification may be used to increase or start monitoring for voltage changes by the plug-in energy sensor. A start time may be any identifier or marker indicating a time at which the radiated electromagnetic energy change at the premises is detected. In some implementations, the plug-in energy sensor may be synchronized with a timing clock, such as a clock signal transmitted over a wireless network at the premises. In such an example, the start time may be a time determined from the clock signal when the radiated electromagnetic energy change is detected. Alternatively, the start time may be a defined time prior to the detected change (e.g., five seconds). Likewise, because the voltage signal and the radiated electromagnetic energy are both measured by the plug-in energy sensor, the two signals are tied to the same clock and therefor synchronized.

In addition to recording the start time and generating a radiated electromagnetic energy change notification, the radiated electromagnetic energy data at the premises is recorded, as in 908. For example, the radiated electromagnetic energy data may be recorded to memory. In other implementations, the radiated electromagnetic energy data may be processed as it is received to remove the baseline radiated electromagnetic energy signature data and/or radiated electromagnetic energy signature data from other operating devices, such that only the signature data generated by the change in radiated electromagnetic energy due to device operation remains, and that change recorded. In still other examples, the radiated electromagnetic energy data may be periodically sampled and those samples, or the change in the radiated electromagnetic energy represented in those samples, recorded. For example, samples of the radiated electromagnetic energy data may be obtained once per second and the radiated electromagnetic energy signature data for the device determined from the samples.

As the radiated electromagnetic energy data is recorded, a determination is made as to whether the change in the radiated electromagnetic energy has terminated, as in 910. Determining whether the change in radiated electromagnetic energy has terminated may be done for a period of time before it is confirmed that the change has terminated. For example, some device states may not radiate electromagnetic energy during a period of time, but the device may still be in the same device state. By confirming that there is no radiated electromagnetic energy change for a defined period of time, e.g., five seconds, it may be confirmed whether the device has changed device states.

If it is determined that the radiated electromagnetic energy change has not terminated, the example process 900 returns to block 908 and continues. However, once the device state changes, the radiated electromagnetic energy will also terminate or change, and the transition will be detected by the example process 900. When it is determined that the radiated electromagnetic energy has transitioned, a stop time indicating the change is recorded, as in 912.

Finally, the recorded radiated electromagnetic energy data between the start time and the stop time is processed to extract the radiated electromagnetic energy signature data of the device, as in 914. As discussed, the radiated electromagnetic energy signature data may be extracted by subtracting out the baseline radiated electromagnetic energy signature data and/or by comparing the recorded radiated electromagnetic energy over a rolling window between the start time and the stop time.

In some implementations, if the premises includes two or more plug-in energy sensors the approximate device position of an operating device at the premises can be determined based on the measured intensity of the radiated electromagnetic energy emitted from the device during the operation. Such additional information may be used as another input in determining a device, device type, or device element from a detected change in the radiated electromagnetic energy at the premises and/or a detected change in the voltage at the premises.

Figure 10:
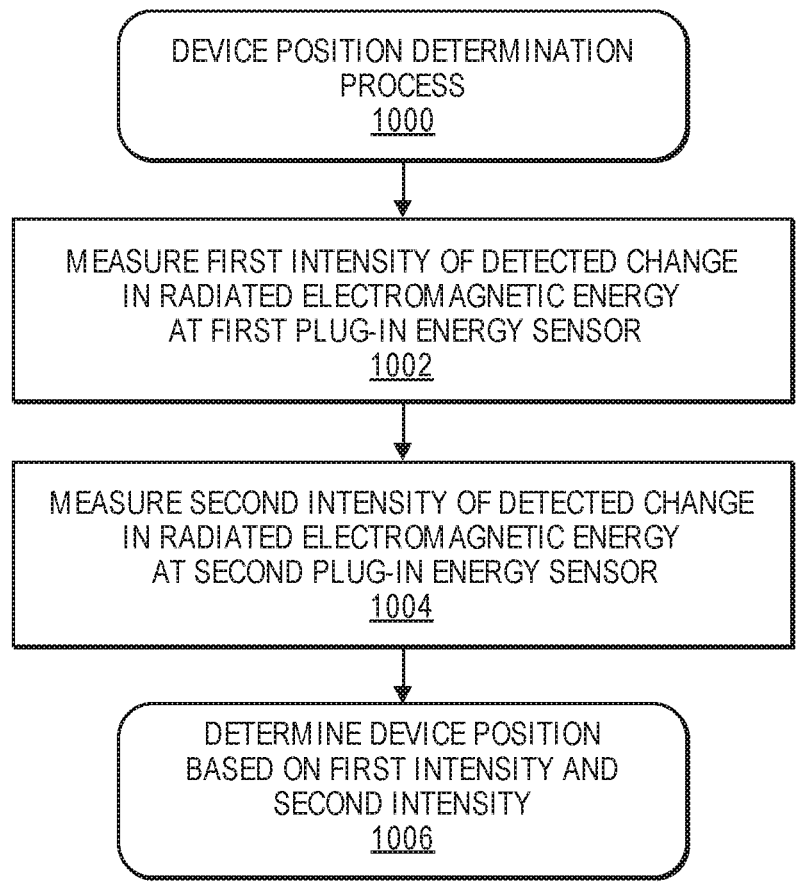
FIG. 10 illustrates an example device position determination process, in accordance with described implementations.

FIG. 10 illustrates an example device position determination process 1000, in accordance with described implementations.

The example process 1000 begins by measuring a first intensity of a detected change in the radiated electromagnetic energy at a first plug-in energy sensor at the premises, as in 1002. Concurrently, the intensity of the detected change in the radiated electromagnetic energy may also be measured at the second plug-in energy sensor, as in 1004. Based on the measured intensity at each of the plug-in energy sensors, the approximate device position within the premises can be determined, as in 1006.

For example, an intensity distribution for a device may be known and based on that distribution, the distance but not direction from the first plug-in energy sensor can be determined. Likewise, based on the known intensity distribution for the device, the distance but not direction from the second plug-in energy sensor can be determined. Finally, based on an overlap between those to distances, the approximate position of the device can be determined.

Alternatively, or in addition thereto, multiple plug-in energy sensors may also be able to determine or distinguish between two devices of a same device type at the premises (e.g., two refrigerators of the same type—one in the kitchen and one in the garage). In particular, the intensity of radiated electromagnetic energy of each device will be different for each plug-in energy sensor due to the different positions of the devices with respect to those plug-in energy sensors. For example, when a first device of the device type (e.g., refrigerator in the kitchen) is operating the intensity of that device at the two or more plug-in energy sensors will be different than the intensity of a second device of the same device type (e.g., refrigerator in the garage) at a different position within the premises when that second device is operating. Base on the differences in intensities of radiated electromagnetic energy detected from the different devices by the multiple plug-in energy sensors, it can be determined that there are two instances of the same or similar device at the premises.

In some implementations, device type, device, device element, or device operational state may be determined using a trained machine learning model that receives as inputs the voltage signature data and/or radiated electromagnetic energy signature data and provides as output the device type, device, device element, and/or device operational state.

Figure 11:
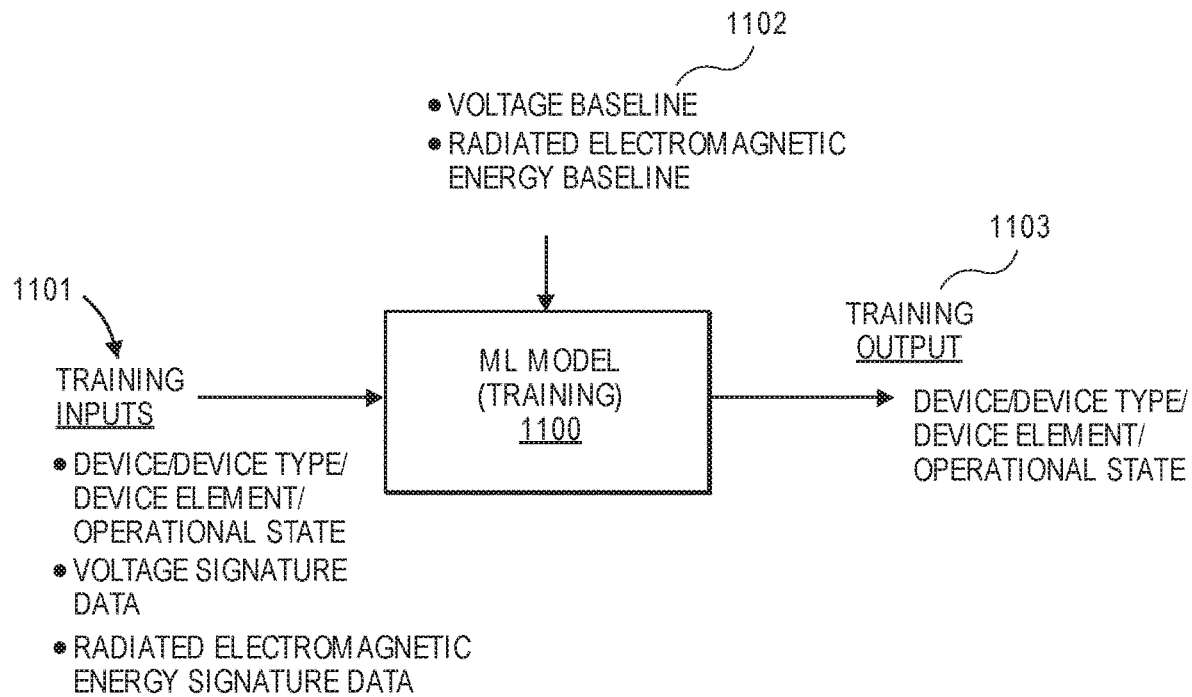
FIG. 11 illustrates training of a machine learning model, in accordance with described implementations.

FIG. 11 illustrates training of a machine learning model 1100, in accordance with described implementations. The machine learning model may be, for example, a convolutional neural network ("CNN").

During training, the machine learning model 1100 may be provided with training inputs 1101 such as a device type, device identification, device element, or device operational state, along with corresponding voltage signature data and/or radiated electromagnetic energy signature data for the indicated device. In some implementations, these may be pure signals measured from the device, such as by a manufacturer. In other implementations, the voltage signature data and radiated electromagnetic energy signature data may be extracted from a measured voltage signal and/or measured radiated electromagnetic energy at a premises, as discussed above. In some implementations, a voltage baseline and/or radiated electromagnetic energy baseline for a premises to which the machine learning model 1102 is being trained may also be provided as part of the training inputs. In such an example, the machine learning model, as part of its training, may be trained to process a received voltage and/or radiated electromagnetic energy to extract the voltage signature data and/or radiated electromagnetic energy signature data and determine, from the extracted voltage signature data and/or radiated electromagnetic energy signature data, the device, device type, device element, and/or device operational state.

With the provided training inputs, the machine learning model is trained to provide as an output 1103 the device, device type, device element, and/or device operational state based on the input voltage signature data and/or radiated electromagnetic energy signature data. Likewise, the machine learning model may be further trained to detect multiple devices operating at the same time by processing a received voltage and/or radiated electromagnetic energy to extract the baseline voltage, voltage signature data for each device, and the radiated electromagnetic energy signature data for each device. Such extraction may be an iterative process in which the machine learning model determines potential combinations of signature data pairs represented in the voltage data and radiated electromagnetic energy data to determine the different devices.

Figure 12:
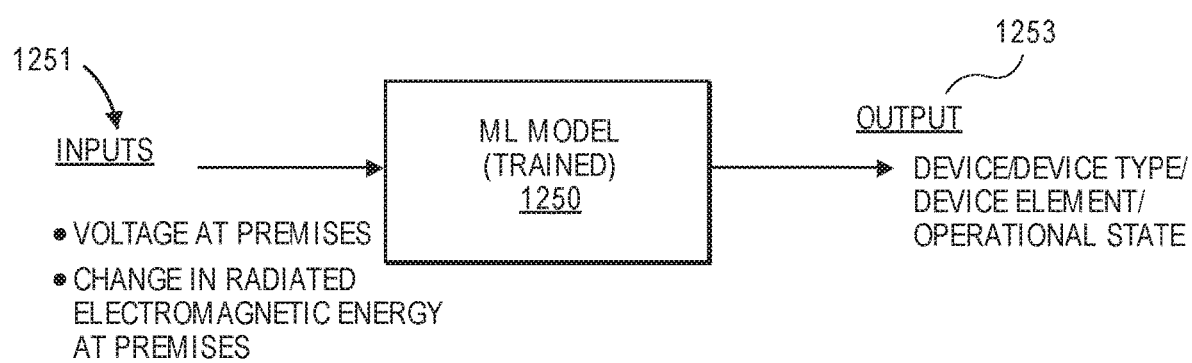
FIG. 12 illustrates an example trained machine learning model, in accordance with described implementations.

FIG. 12 illustrates an example trained machine learning model 1250, in accordance with described implementations.

Upon training of the machine learning model, as discussed above with respect to FIG. 11, the trained machine learning model 1250 may receive as inputs 1251 the voltage measured at a premises and/or the radiated electromagnetic energy measured at the premises and determine, as outputs 1253 the device, device type, device element, and/or device operational state of one or more devices represented in the received voltage and/or radiated electromagnetic energy. For example, as discussed above, the trained machine learning model may process the received voltage and radiated electromagnetic energy to detect several different signature pairs corresponding to different devices operating at the premises and provide as outputs the device, device type, device element, or device operational state for each of those different devices. Through use of multiple signatures (voltage signature data, radiated electromagnetic energy signature data) that are concurrently measured and thus signature pairs, the detectability of multiple devices operating simultaneously increases compared to device detection using a single signature, such as a voltage signature or a radiated electromagnetic energy signature.

In still other implementations, as discussed below with respect to FIG. 13, signature data pairs may also be used as inputs to train the machine learning model to further increase detectability of a device.

Figure 13:
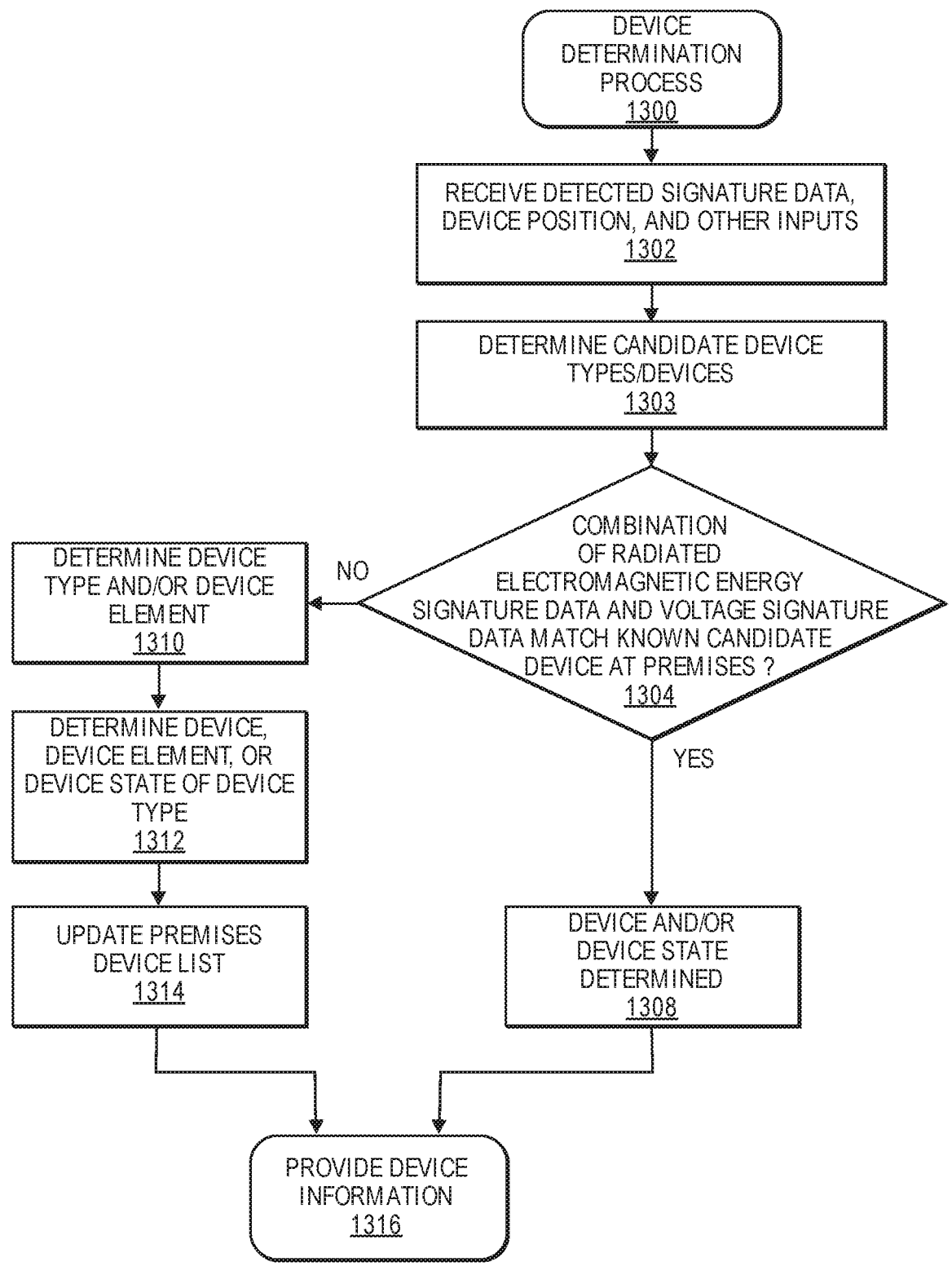
FIG. 13 illustrates an example device determination process, in accordance with described implementations.

FIG. 13 illustrates an example device determination process 1300, in accordance with described implementations. The example process 1300 may be performed at the plug-in energy sensor, at a communication hub or communication component at the premises, at the remote management system, or portions of the example process 1300 may be performed at different locations.

The example process 1300 begins upon receipt of a detected signature data (voltage signature data and/or radiated electromagnetic energy signature data), device position, user presence, and/or other inputs, as in 1302. Other inputs may include, but are not limited to, voltage signature data detected from one or more loads introduced into the circuit by the plug-in energy sensor and/or another plug-in energy sensor, during operation of the device, data from the operating device and/or other devices or sensors at the premises, energy usage information, etc. For example, other devices at the premises may provide data indicating presence of users at the premises, changes in environment conditions at the premises (e.g., lighting changes resulting from the on/off of a light at the premises, temperature changes), etc. In still other examples, other inputs may include the time of day and predictive modeling that has been developed for the premises over a period of time to predict candidate devices that may be operating and/or the device state of those devices.

If other inputs are received, those inputs may be used to determine candidate device types, candidate devices, and/or candidate device elements that may have been operating or confirmed to not be operating at the premises, as in 1303. As inputs are collected and associated with identified devices, those inputs may be used as data points to determine candidate device types, candidate devices, or candidate device elements for consideration in device identification and/or device state determination.

Once candidate devices are determined, the signature data pair (voltage signature data, radiated electromagnetic energy signature data) is compared with known signature data pairs of those candidate devices and/or signature data pairs of different device states of those candidate devices to determine if there is a match between the received signature data pairs and a known signature data pair of a known candidate device or device state of a known candidate device at the premises, as in 1304. In some implementations, each time the example process 1300 is performed, and a new device or device state is identified for a premises, the device and/or device state and corresponding signature data pair may be added to a premises datastore that identifies devices and/or device states and corresponding signature data for the premises. Then, when the example process 1300 is performed in the future, it may first compare a received signature data pair with signature data pairs of devices and/or device states of devices known to be at the premises, thereby reducing processing time and compute requirements and increasing accuracy of device identification and/or device state determination for the premises. In addition, in some implementations, the identity of the identified device and/or device state and corresponding signature data pair may be provided to the remote management system and added to the device signature data store for the device/device state and aggregated with signature data of other premises for use in future identification of devices and/or device states at various premises.

If it is determined that the signature data pair matches a signature data pair of a candidate device known to be at the premises and/or a device state of a candidate device known to be at the premises, the device and/or device state is determined, as in 1308. However, if it is determined that the signature data pair does not match a stored signature data pair of a candidate device known to be at the premises and/or a device state of a candidate device known to be at the premises, additional processing of the signature data pair is performed to determine a device type and/or device element corresponding to the signature data, as in 1310. Additional processing may include comparing the signature data pair to different signature data pair profiles for different device types/device elements and/or processing segments of the voltage signature data and/or radiated electromagnetic energy signature data of the signature data pair to identify markers in the signature data that correspond with markers of different device types and/or different device elements. For example, voltage signatures of all brands of microwave ovens may include markers that are common or similar. For example, all brands of microwave ovens may have an initial voltage increase at power on (a device state), a second voltage increase when rotation of the turntable is activated (another device state), and a third voltage increase when the magnetron of the microwave is energized (another device state). While these voltage increases and device states may be different for different brands of microwaves, the pattern or relationship between the state changes may be similar, thereby generating markers for all brands of microwaves that may be utilized to initially classify signature data by device type (e.g., microwave). Markers and/or marker patterns may also be present in electromagnetic energy radiated by devices of a same device type that may be used to determine a device type of a device.

Upon determination of the device type and/or device element, the signature data pair may then be compared to stored signature data pairs of devices of that device type and/or devices that include the determined device element to determine the specific device and/or device state(s) that generated the received signature data pair, as in 1312. Similar to comparing the received signature data pair with stored signature data of candidate devices known to be at the premises and/or device states of candidate devices known to be at the premises, to determine a device of the device type or that includes the device element, the received signature data pair is compared with signature data of devices or device states of devices of the device type and/or devices that have or include the determined device element to determine the stored signature data pair that has a highest similarity to the received signature data pair. In some implementations, a confidence level may be determined and if it cannot be determined with a high enough degree of confidence, a notification may be sent to the premises that identifies the device or devices that have been determined to have similar signature data pairs, along with a request for device confirmation. In such an example, the potential devices may be indicated to a user at the premises and the user may select or specify the correct device. Once the device and/or device state has been determined, the premises device list may be updated to include the device and/or device state and the signature data pair corresponding to that device/device state, as in 1314.

Upon determination of the device and/or device state in block 1308 or upon updating the premises device list at block 1314, device information for the device is provided, as in 1316. As discussed above, device information may include, but is not limited to, the device type, the device identifier, the operating state of the device, the energy consumed by the device, recommended energy saving actions, etc.

As noted above, some or all of the example process 1300 may be performed at the plug-in energy sensor, some or all of the example process 1300 may be performed by the communication hub or the communication component, and/or some or all of the example process 1300 may be performed by the remote management system. For example, the plug-in energy sensor and/or the communication hub/component may maintain, in memory, signature data pairs for devices known to be at the premises and/or device states of devices known to be at the premises and may perform steps 1300 through 1308. However, if the signature data pair is not matched with a signature data pair of a known device/device state, the signature data pair may be sent via a network to the management system and the management system may perform steps 1310 through 1314 to determine the device and/or device state represented by the signature data pair.

Figure 14:
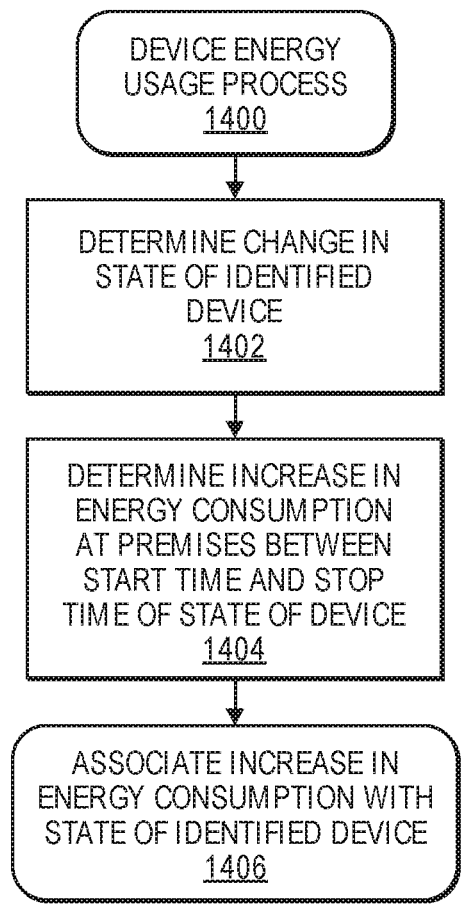
FIG. 14 illustrates an example device energy usage determination process, in accordance with described implementations.

FIG. 14 illustrates an example device energy usage determination process 1400, in accordance with described implementations. The example process 1400 begins by determining a start time and a stop time corresponding to a device state change for an identified device at the premises, as in 1402. As discussed above, the start time and stop time may be generated by the plug-in energy sensor based on detected changes in voltage at the premises and/or based on detected changes in the measured radiated electromagnetic energy at the premises.

During a period of time between the start time and the stop time, an increase in energy consumed at the premises is determined, compared to energy usage before and/or after the period of time, as in 1404. For example, the power supply company may provide time based energy consumption data for the premises and the example process 1400 may determine a difference between the energy consumption during the period of time and the energy consumption before and/or after the period of time. The increase or difference in the energy consumption during the period of time is associated with the device as the amount of energy consumed by the device while operating during the period of time, as in 1406.

In other implementations, energy consumption data may be obtained from devices at the premises, such as a power meter at the premises, the operating device itself, other devices, etc. For example, the power meter may wirelessly transmit energy consumption data for the premises and the plug-in energy sensor and/or communication component may receive the energy consumption data and use it with the example process 1400.

As discussed above, based on energy consumption determined for devices at a premises, one or more energy saving actions may be performed and/or recommended. For example, it may be determined based on an expected energy consumption and an actual energy consumption that a device at the premises needs to be serviced or replaced. As another example, it may be determined that a device should be replaced with a more efficient device of the same device type and/or that operation of the device should be done at a different time of day. In some implementations, the voltage pattern on the ground wire may provide an indication that a device needs servicing and/or is potentially malfunctioning. For example, if a device is beginning to malfunction, it may begin introducing a voltage onto the ground wire. Such an indication may be identified by the disclosed implementations as an indication of potential device malfunction.

In still other examples, based on the operation time of devices or device states of devices, one or more related devices may be identified. For example, over a period of time it may be determined that certain devices operate in parallel or at the same time as other devices. For example, lighting above a stove and/or an exhaust fan may always be turned on in conjunction with operation of the stovetop in a kitchen at the premises. Upon determination of such related devices, the device state of one or more of those devices may be automatically controlled or change when the state of another related device changes. In addition, such patterns of device operation may be utilized as inputs for predictively determining candidate devices that may be operating at the premises.

Figure 15A:
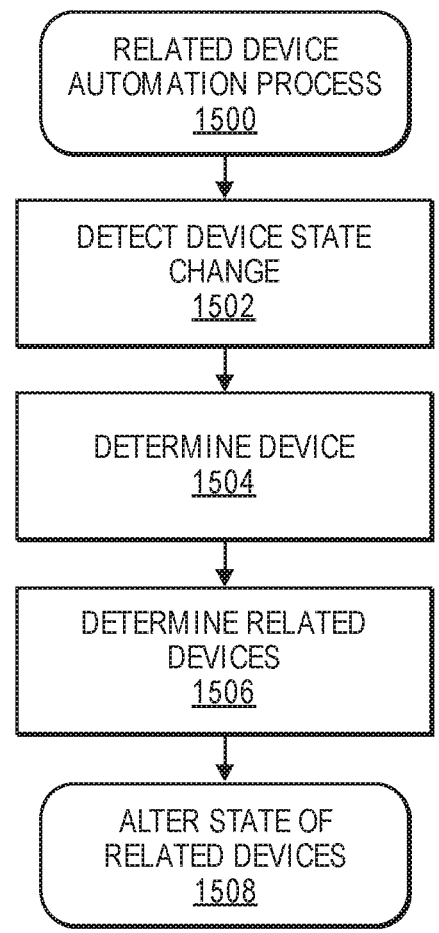
FIG. 15A illustrates an example related device automation process, in accordance with described implementations.

FIG. 15A illustrates an example related device automation process 1500, in accordance with described implementations. In this example, device signature data detected over a period of time may be identified as related if the same device signature data are consistently detected at the same or similar time, or in the same pattern of operation. Likewise, the devices and corresponding times of particular device states may be maintained and used as inputs in determining candidate devices in the future.

The example process 1500 begins upon detection of a device state change for a device, as in 1502. A state change may be detected when a voltage signature data and/or radiated electromagnetic energy signature data for the device is identified, indicating that the device has been powered on, powered off, or changed between any two states of device states for the device. As another example, a state change may be detected when a voltage signature data and/or radiated electromagnetic energy signature data for a device terminates, indicating that the device has been powered down or operation of the device has ceased.

Upon detection of a state change, the device that caused the state change is determined, as in 1504. Device determination may be performed using any of the implementations discussed above. In addition to determining the device for which the state change is detected, one or more related devices that are associated with the device are determined, as in 1506. Likewise, the state of those related devices when the detected device is in the current state is determined. Based on the state of the detected device and the state for each related device, the state of those related devices may be automatically updated or changed, as in 1508. By automating the state change of related devices, energy may be conserved that may otherwise be wasted if a user, for example, forgets to turn off a device when it is no longer needed. For example, lights above a stovetop may be automatically shut off (state change) a defined period of time after the state of the stovetop changes from active to inactive.

Figure 15B:
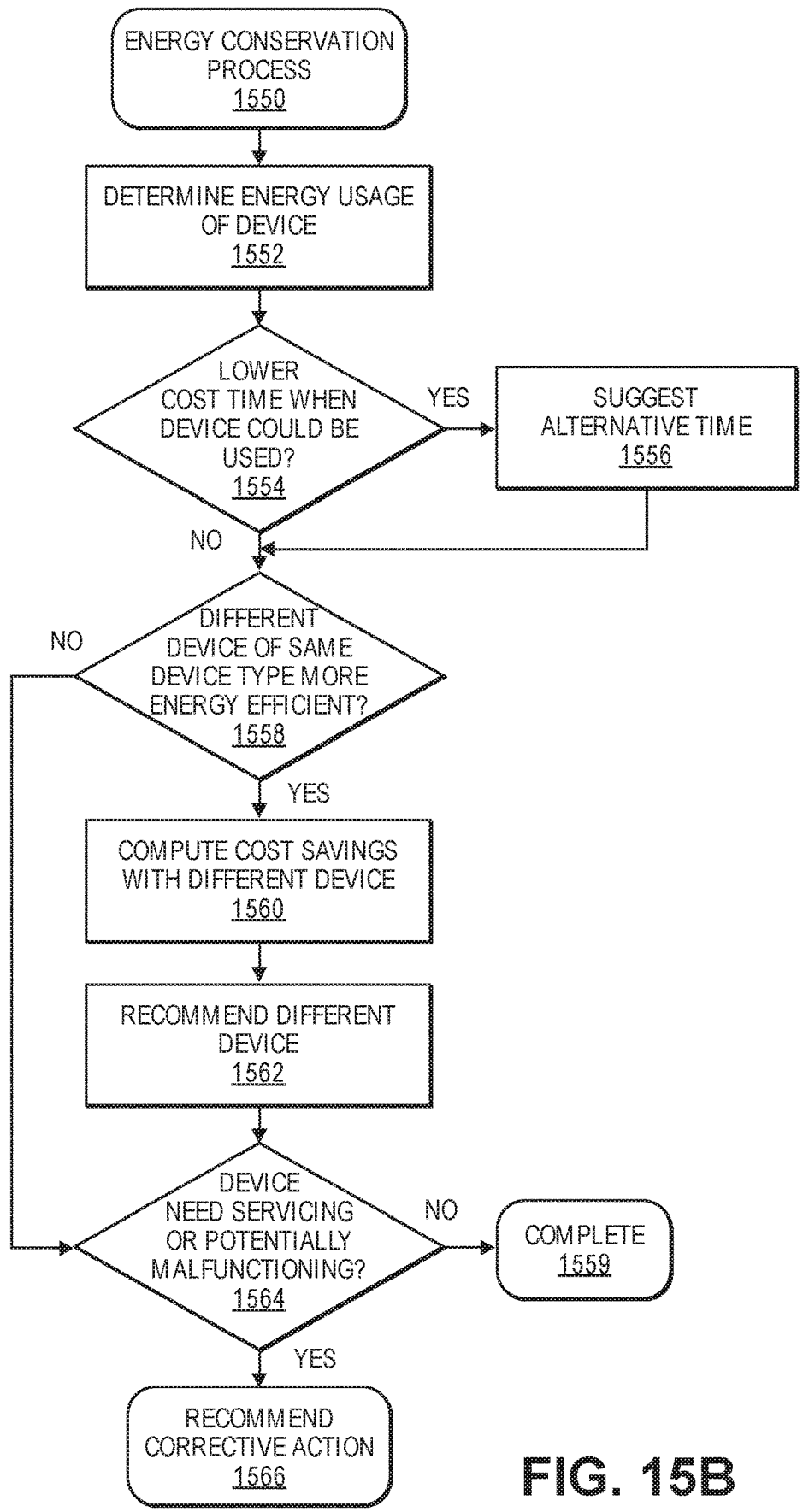
FIG. 15B illustrates an example energy conservation process, in accordance with described implementations.

FIG. 15B illustrates an example energy conservation process 1550, in accordance with described implementations. The example process 1550 begins by determining energy usage for a device at a premises, as in 1552. Energy usage for a device may be determined using any of the above described implementations.

A determination may then be made as to whether there is a lower cost time when the device could be used at the premises, as in 1554. In some implementations, a third party or power company may identify per unit costs for energy and there may be a difference in the cost depending on the actual or expected demands. For example, the cost of energy may be lower late at night compared to the afternoon when more devices are in use. However, user convenience may also be considered in determining whether a lower cost time is available for device operation. For example, while operation of an air conditioner may be cheaper late at night, it may be inconvenient for a user at the premises to not have air conditioning during peak heat hours of the day. In comparison, operation of a dishwasher, washing machine, dryer, etc., may be optimized to different times when the cost of energy consumed is lower, without inconveniencing the user.

If it is determined that there is a lower cost time when the device may be operated, the alternative time may be suggested or implemented, as in 1556. If it is determined that there is not a lower cost time, or after suggesting or implementing a lower cost time, a determination is made as to whether a different device of a same device type is more energy efficient than the existing device, as in 1558. As discussed above, manufacturers (third parties) may provide expected energy consumption information for various devices. Utilizing that information, actual energy consumption for a device at a premises may be compared to expected energy consumption for other devices of the device type to determine an energy savings that may be realized if the device were replaced. If there is no other device that is more efficient, the example process 1550 completes, as in 1559.

If there are other devices of the same device type that are more efficient, the energy consumption savings for an alternative device may then be computed as a cost savings for the premises based on the time(s) of device operation, the cost of energy, device cost, and/or difference in energy that would be saved, as in 1560. Such cost savings may be represented as a return on investment and/or on-going cost savings. The cost savings and alternative device may be recommended as a replacement, as in 1562. As discussed above, the recommendation may be output to a user at the premises via the communication component at the premises and/or through other devices.

In some implementations, a determination may also be made as to whether the device needs servicing and/or is potentially malfunctioning, as in 1564. For example, the voltage pattern on the ground wire may be monitored and if the voltage on the ground wire from the device increases, such an increase may indicate a potential device malfunction. As another example, if the actual energy consumption of the device during operation exceeds an expected energy consumption threshold, it may be determined that the device is not operating at optimum efficiency for the device and needs to be serviced.

If it is determined that the device needs servicing, and/or the device is potentially malfunctioning, recommended corrective action may be provided to a user at the premises, as in 1566. As discussed above, the recommended corrective action may be output to a user at the premises via the communication component at the premises and/or through other devices. If it is determined that the device is not in need of servicing and not potentially malfunctioning, the example process completes, as in 1559.

Figure 16:
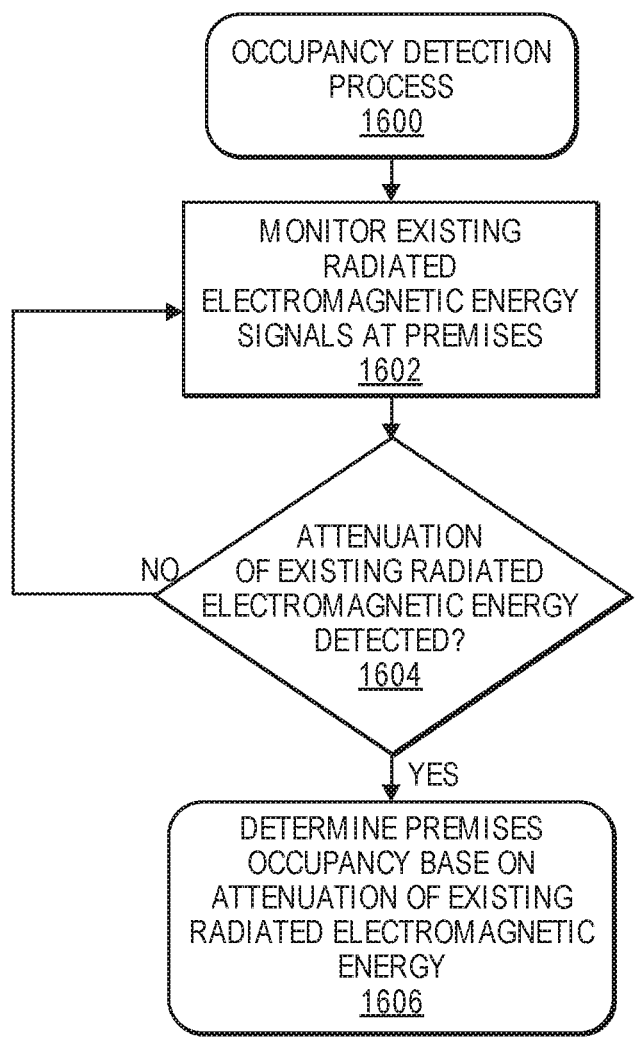
FIG. 16 illustrates an example occupancy detection process, in accordance with described implementations.

FIG. 16 illustrates an example occupancy detection process 1600, in accordance with described implementations.

The example process 1600 begins by monitoring existing radiated electromagnetic energy at a premises, as in 1602. As discussed above, there is typically a baseline radiated electromagnetic energy that can be monitored by the plug-in energy sensor, such as radiated electromagnetic energy emitted by a Wi-Fi access point at the premises.

As the radiated electromagnetic energy is monitored, a determination is made as to whether an attenuation of that measured existing r radiated electromagnetic energy is detected, as in 1604. If no attention is detected, the example process 1600 returns to block 1602 and continues. However, if attenuation of the radiated electromagnetic energy is detected, the attenuation is indicative of a human or other animal passing between the plug-in energy sensor and the device radiating the electromagnetic energy being measured by the plug-in energy sensor, thereby indicating occupancy of the premises. In some implementations, the example process may continue to monitor the radiated electromagnetic energy to determine if the attenuation changes such that the radiated electromagnetic energy goes back to the intensity prior to the attenuation or if it remains attenuated. If the attenuation goes away, such a change may be indicative of a human or other animal walking through a room in which the plug-in energy sensor is located. Continuation of the attenuation of the radiated electromagnetic energy may be indicative of a human or other animal entering and remaining in the room in which the plug-in energy sensor is located.

Figure 17:
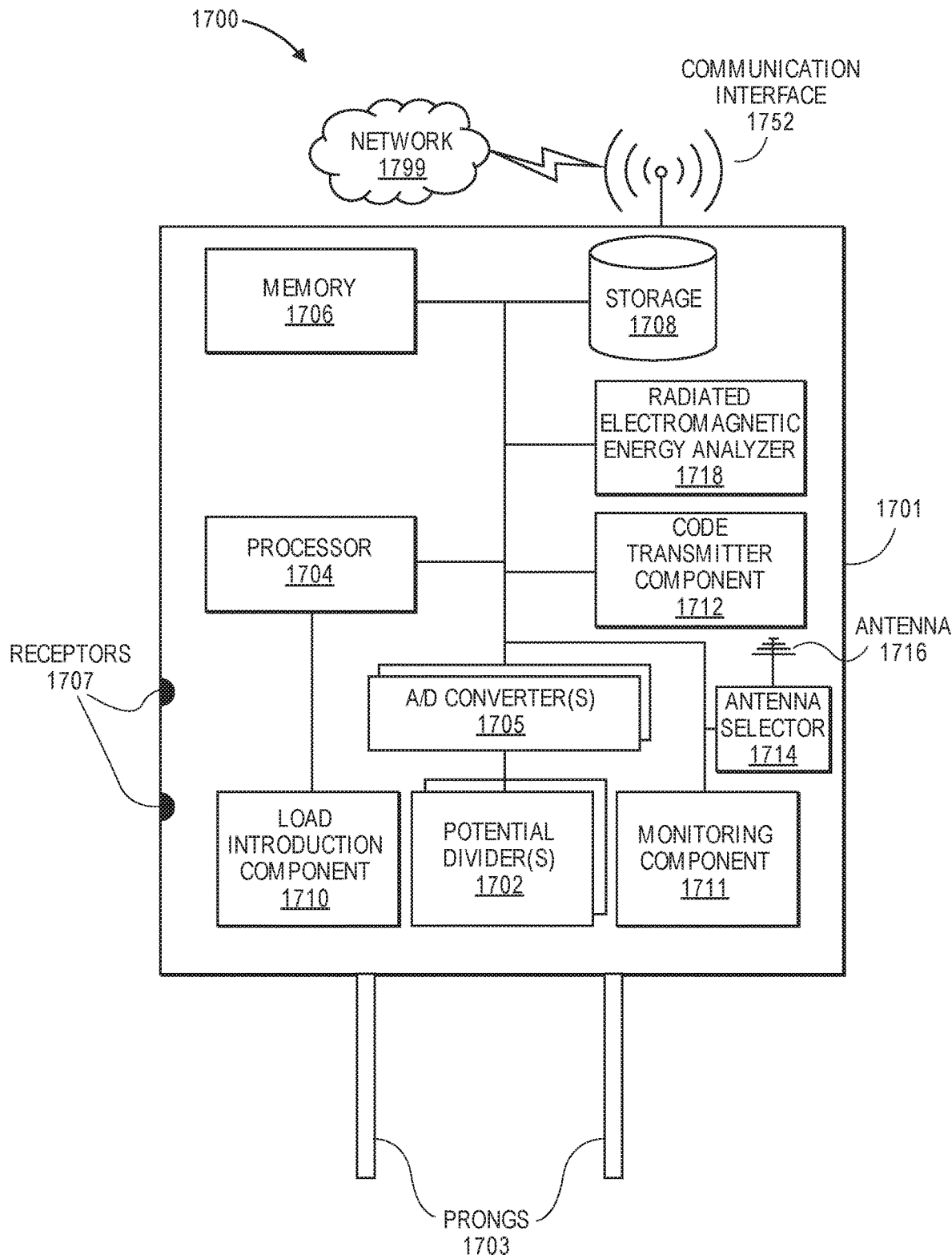
FIG. 17 illustrates example components of a plug-in energy sensor, in accordance with described implementations.

FIG. 17 illustrates example components of a plug-in energy sensor 1700, in accordance with described implementations. In implementations, the plug-in energy sensor 1700 is configured to be installed into an electrical outlet to interact with an electrical circuit at the premises. As such, the plug-in energy sensor will include an insulating housing 1701, such as a plastic body or shell. In some implementations, the housing 1701 will be in the form of a cube such that the plug-in energy sensor has an appearance of a charger or other common electrical component. Protruding from the housing is at least one prong 1703. In most instances, as illustrated in FIG. 17, there are two prongs 1703 extending from the housing. In some implementations, there may be a third prong, or ground. The prongs interface with the electrical circuit at the premises and enable the plug-in energy sensor to monitor voltage at the premises, transmit codes, and/or introduce loads into the circuit at the premises. For example, the prongs may be inserted into a common electrical outlet at the premises.

Coupled to the prongs 1703 are one or more potential dividers 1702, such as voltage dividers. In some implementations there are three potential dividers, one for voltage measured from the hot wire, one for voltage measured from the neutral wire, and one for voltage measured from the ground wire. In other implementations, there may be additional or fewer potential dividers. The potential dividers 1702 convert a high voltage, such as 120 volts, of the electrical circuit at the premises into a lower voltage that can be recorded and analyzed at high frequencies (e.g., 200 kilohertz).

The one or more potential dividers may be coupled to one or more analog-to-digital converters 1705. The analog-to-digital converters receive the high frequency sampling produced by the one or more potential dividers 1702 and convert the analog signal to digital data, referred to herein as voltage data. The voltage data may be stored to memory, such as a random access memory ("RAM"), flash memory, or other form of permanent or temporary storage 1708. Any form of memory may be used with the disclosed implementations.

The prongs 1703 may also be coupled to a load introduction component 1710, a code transmitter component 1712, and/or a monitoring component 1711. The load introduction component may be operable to introduce one or more loads into the electrical circuit to which the plug-in energy sensor is coupled. For example, the load introduction component may be operable to introduce any one or more of a resistive load, an inductive load, or a capacitive load into the electrical circuit. The code transmitter component may be operable to transmit one or more codes that may be detectable by other plug-in energy sensors and/or communication components at the premises to determine if two or more plug-in energy sensors are on the same phase of the electrical circuit at the premises. Likewise, the monitoring component may be configured to monitor voltage patterns on the electrical circuit and/or detect codes transmitted from other plug-in energy sensors.

As discussed above, the monitoring component may include components that are configured to measure voltage patterns between the hot and ground wire, the neutral and ground wire, and/or the ground wire and a reference point. The voltage patterns in the different wires (hot, neutral, ground) may be monitored simultaneously by different components of the monitoring component. Likewise, the monitoring component may be in communication with the processor 1704, the memory 1706, and/or the communication interface 1752.

Also included in the plug-in energy sensor may be a radiated electromagnetic energy analyzer 1718, such as a narrow-band swept frequency analyzer or a wide-band frequency analyzer that is operable to measure radiated electromagnetic energy around the plug-in energy sensor. The radiated electromagnetic energy analyzer 1718 may be coupled to an antenna 1716. Alternatively, or in addition thereto, the radiated electromagnetic energy analyzer may use the electrical wiring within the premises as an antenna. For example, the radiated electromagnetic energy analyzer 1718 may be coupled to the prongs 1703 and when the plug-in energy sensor is plugged into an electrical outlet at the premises, the electrical circuit of the premises may function as an antenna for the radiated electromagnetic energy analyzer. In some implementations, the plug-in energy sensor 1700 may include an antenna selector 1714 that enables switching between the antenna 1716 of the plug-in energy sensor and the electrical prongs 1703 that enable use of the electrical wiring of the premises to function as the antenna. The radiated electromagnetic energy analyzer 1718 may collect and monitor radiated electromagnetic energy to determine changes in the radiated electromagnetic energy, as discussed herein.

The memory 1706 stores program instructions that are executable by the one or more processors to cause the one or more processors to perform any one or more portions of the implementations discussed herein. In addition, the memory 1706 and/or the storage 1708 may also maintain a signature data store that includes, for example, voltage signature data, radiated electromagnetic energy signature data, and/or signature data pairs of devices known to be at the premises and/or device states of devices known to be at the premises.

The plug-in energy sensor 1700 may also include a communication interface 1752, such as a wireless antenna, that enables the plug-in energy sensor to connect to one or more wireless networks 1799, such as a Wi-Fi network, Bluetooth network, etc., and transmit or receive information, such as detected signature data, voltage data, codes, etc.

In some implementations, the plug-in energy sensor may also include a pair of electrical prong receptors 1707 that are configured to receive electrical prongs of another device and allow alternating current to pass through so that the electrical outlet may be utilized by another device, in addition to the plug-in energy sensor 1700. In still other implementations, some or all of the components of the plug-in energy sensor 1700 may be incorporated entirely into another device, such as a communication component, a communication hub, a device, etc.

While the above example illustrates a plug-in energy sensor 1700 that includes components for voltage measurement and components for radiated electromagnetic energy measurement, in other implementations, the plug-in energy sensor may only include components for voltage measurement or may only include components for radiated electromagnetic energy measurement.

Figure 18:
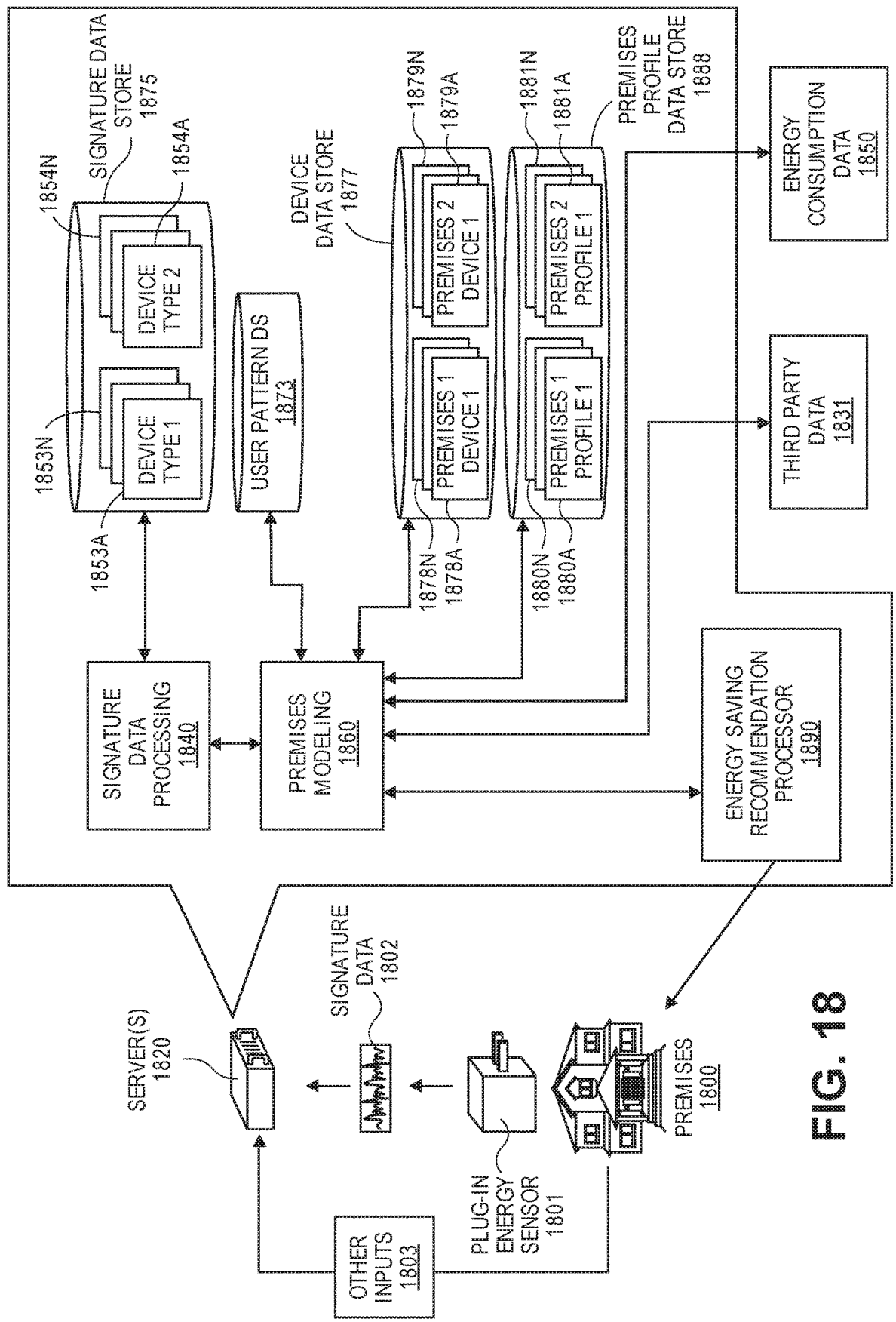
FIG. 18 illustrates example components of a management system, in accordance with described implementations.

FIG. 18 is a conceptual diagram of a server 1820 that processes voltage data and/or radiated electromagnetic energy data 1802 (signature data) and/or other inputs 1803 received from plug-in energy sensors 1801 at various premises 1800, receives third party data 1831 from third parties, energy consumption data 1850 for different premises 1800, and provides energy saving recommendations, in accordance with described implementations. The various components of the server 1820 may be located on the same or different physical devices. Communication between various components illustrated in FIG. 18 may occur directly or across a network. The server 1820 discussed with respect to this FIG. 18 may be the same or a different server than the server(s) discussed above. In operation, the server 1820 may include computer-readable and computer-executable instructions that reside on the server 1820 and perform one or more of the described features or functions, also referred to herein as a management system.

The energy savings recommendation processor 1890 may function to determine and recommend one or more energy savings actions, such as operating a device at a different time of day or replacing a device with a more energy efficient model. Upon determining one or more energy savings actions to be performed at a premises, the energy savings recommendation processor 1890 may generate and send command data and/or message data to a communication component, communication hub, and/or devices at the premises 1800 for presentation to a user at the premises and/or for programmatic execution by the device(s) at the premises 1800.

Signature data 1802 (voltage data and/or radiated electromagnetic energy signature data), from one or more plug-in energy sensors 1801 at a premises 1800 is transmitted in real time, near real time, or periodically to one or more remote computing resources, illustrated in this example as a server 1820. The server receives and processes the signature data 1802 with signature data processing 1840. Processing may include processing the signature data to determine a device, a device type, device element, and/or device state that generated the signature data 1802 by comparing the signature data to stored signature data that is known to be generated by different devices, device types, device elements, and/or device states to determine differences between the stored signature data and the received or determined signature data 1802. The signature data store 1875 may maintain device type information and/or signature models, which may include markers representative of different signature data for different device types. For example, signature data of device type 1 may include multiple different markers 1853A-1853N corresponding to different voltage changes at different time intervals and/or radiated electromagnetic energy at different frequencies that are characteristic of devices of a particular device type. Likewise, signature data of device type 2 may include multiple different markers 1854A-1854N corresponding to signature data generated by devices of that device type.

The device types and/or device signature data maintained in the signature data store 1875 may be aggregated from multiple premises as devices at those premises are determined. The aggregated data may then be used to identify devices and/or device states of devices at other premises and, as those devices/device states are identified, the device signature data at those premises added to the data store. As such, the signature data store 1875 will continue to expand and include device signature data for more and more devices and/or device states of devices.

In some implementations, rather than signature data 1802 being sent from the premises 1800 to the servers 1820, the plug-in energy sensor 1801, a communication hub at the premises, or a communication component at the premises may process the signature data to determine a device, device type, device element, and/or device state of a device at the premises that generated the signature data. A device identifier of the determined device and/or device state, a start time and a stop time corresponding to the signature data may then be sent to the servers 1820 for additional processing.

As signature data is collected and devices and/or device states determined, the information, including the device and/or device state identifiers, signature data, times of operation, etc., may be aggregated with other signature data generated by other devices at the premises 1800 to develop a premises profile 1880, that is stored in a premises profile data store 1888, using a premises modeling component

1860. The premises profile 1880 may include device identifiers and/or signature data for devices and/or device states of devices known or determined to be at the premises 1800, any operational relationships between devices and/or device states, signature data of those devices and/or device states, predicted times when those devices will be operating in different device states, etc. In addition, in some implementations, the premises profile 1880 may also maintain expected and/or actual energy consumption information for detected devices. For example, received third party data 1831 may include expected energy consumption information for different device models. The premises modeling component 1860 may also receive energy consumption data 1850 and utilize that information to determine actual energy consumption for devices at the premises. As discussed above, the changes in actual energy consumption at different periods of time may be combined with start times and stop times of determined device operation at the premises 1800 to determine the amount of energy actually consumed by devices at the premises during operation.

As premises profiles 1780 are developed for different premises, those profiles may be stored in a premises profile data store 1888. In some implementations, different premises profiles may be generated for a premises based on, for example, the day of the week, the number of people at the premises, etc. Over time, multiple premises profiles may be created for each premises and maintained in the premises profile data store 1888. For example, premises 1 may include multiple premises profiles 1880A-1880N generated at different points in time for that premises. Likewise, premises 2 may include multiple premises profiles 1881A-1881N generated at different points in time for that premises. Every premises may include one or more premises profiles that are stored in the premises profile data store 1888. The premises profiles, which may be associated with different periods of time during the year, may be used to predict device states and times during which devices are in high demand/high use or low demand/low use.

In some implementations, in addition to determining energy saving actions and expected energy savings, the premises profiles may be used to determine efficiency losses of a device or problems (e.g., mechanical or electrical) with the device. For example, if an expected energy consumption for a device at a premises is different than the actual energy consumption for that device under the same or similar conditions, such a difference may be indicative of problems with the device.

In some implementations, signature data may likewise be used to determine user profiles and/or usage patterns corresponding to the premises 1800. For example, signature data may be used to determine the presence or absence of users at the premises and/or at particular areas within the premises. As users typically follow a patterned behavior, over time, the signature data may be used to determine those user patterns and such information may be stored in the user pattern data store 1873. For example, signature data from device operation of devices at the premises may be aggregated over a period of time (e.g., thirty days) to determine that on Monday, Tuesday, Wednesday, Thursday, and Friday, a user at the premises generally enters the kitchen within the structure between 05:00 hours and 05:30 hours, moves to a second room between 06:30 hours and 07:30 hours and then departs the premises until approximately 18:00 hours. Such information may be maintained in the user profile for the user. In some implementation, occupancy determination based on monitored radiated electromagnetic energy attenuation, as discussed above, may also be used to determine or update user profiles and/or usage patterns for the premises.

In some implementations, a device data store 1877 may also be maintained. The device data store 1877 may include information regarding devices at each premises. For example, the device data store may maintain device information 1878A-1878N for each of multiple different devices at a first premises, maintain device information 1879A-1879N for each of multiple different devices at a second premises, etc.

Device information may include, among other information, signature data generated by different device states of the device, the manufacturer of the device, the make, model, and year of manufacture, the power rating of the device, the efficiency of the device, etc. In some implementations, data received from a same type of device operating at different premises may be compared to determine consistency among devices and/or to detect potential device problems or abnormalities. For example, if there are fifty microwaves of Brand A and forty-nine of them have similar power demands but the fiftieth one has a higher power demand, it may be determined that the fiftieth microwave is potentially malfunctioning.

In response to receiving signature data from the server 1820 (FIG. 18), or when it is otherwise determined that one or more energy saving actions or recommendations are to be determined for a premises, the premises modeling component 1860 obtains current sensor data, third party data 1831, such as expected device energy consumption, actual energy consumption data 1850 for a premises, premises profile and/or user profile data and utilizes that information to determine one or more energy saving actions or recommendations for the premises. For example, one or more modeling algorithms may receive the various inputs and determine one or more energy saving actions for a relevant period of time that will produce the highest energy savings from the premises with the least inconvenience or negative impact on the user. For example, if the energy saving action is to be performed on a Saturday between 12:00 hours and 14:00 hours it may be determined that the most effective energy saving action may be to shut off the hot water heater during that time. Such an action may substantially reduce the power demand from the premises and be of limited interference to the user at the premises because the premises profile, user profile, and/or usage patterns indicate that hot water from the hot water tank is rarely used during that time period.

Upon determining by the premises modeling component 1860 one or more energy saving actions, the energy savings recommendation processor 1890 may generate command data that includes instructions that cause one or more devices to programmatically alter operation in accordance with the energy savings action and/or generate message data that includes a recommendation that is output to a user at the premises to recommend that the user manually alter an operation of one or more devices at the premises in accordance with the energy saving actions. The command data and/or message data may then be sent to a communication component, communication hub, and/or directly to devices at the premises 1800, as discussed above.

Figure 19:
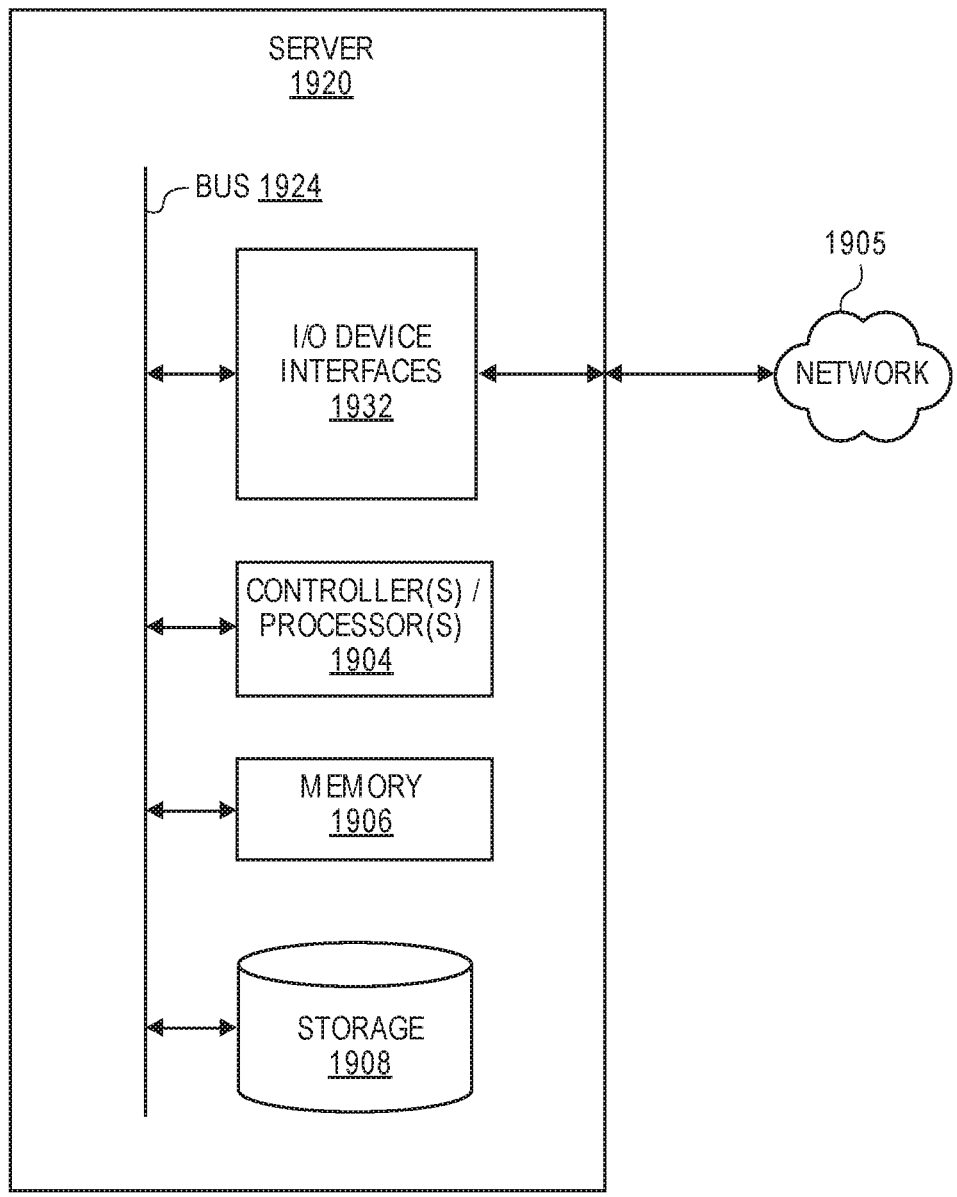
FIG. 19 illustrates example components of a server, in accordance with described implementations.

FIG. 19 is a block diagram conceptually illustrating example components of a remote device, such as a remote server 1920 that may assist with command processing and/or operation of the management system. In operation, the server 1920 may include computer-readable and computer-executable instructions that reside on the server 1920, as will be discussed further below.

The server 1920 may include one or more controllers/processors 1904, that may include a central processing unit (CPU) for processing data and computer-readable instructions, and a memory 1906 for storing data and instructions of the respective device. The memories 1906 may individually include volatile random access memory (RAM), non-volatile read only memory (ROM), non-volatile magnetoresistive (MRAM) and/or other types of memory. The server 1920 may also include a data storage component 1908, for storing data and controller/processor-executable instructions. The data storage component 1908 may include one or more non-volatile storage types such as magnetic storage, optical storage, solid-state storage, etc. The server 1920 may also be connected to removable or external non-volatile memory and/or storage (such as a removable memory card, memory key drive, networked storage, etc.) through an input/output device interface 1932.

Computer instructions for operating the server 1920 and its various components may be executed by the controller(s)/processor(s) 1904, using the memory 1906 as temporary "working" storage at runtime. The server's 1920 computer instructions may be stored in a non-transitory manner in non-volatile memory 1906, storage 1908, or an external device(s). Alternatively, some or all of the executable instructions may be embedded in hardware or firmware on the respective device in addition to or instead of software.

The server 1920 may also include input/output device interfaces 1932. A variety of components may be connected through the input/output device interfaces. Additionally, the server 1920 may include an address/data bus 1924 for conveying data among components of the server 1920. Each component within the server 1920 may also be directly connected to other components in addition to (or instead of) being connected to other components across the bus 1924.

The server 1920 may wirelessly communicate with and receive signature data and/or voltage data from premises and/or provide instructions to devices within the premises and/or receive data from the devices. Any form of wired and/or wireless communication may be utilized to facilitate communication between the server 1920, plug-in energy sensors, communication hubs, communication components, and/or devices. For example, any one or more of 802.15.4 (ZIGBEE), 802.11 (WI-FI), 802.16 (WiMAX), BLUETOOTH, Z-WAVE, near field communication ("NFC"), etc., may be used to communicate between the server 1920 and one or more plug-in energy sensors, communication components, communication hubs, and/or devices.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, communications, energy management, and speech processing should recognize that components and process steps described herein may be interchangeable with other components or steps, or combinations of components or steps, and still achieve the benefits and advantages of the present disclosure. Moreover, it should be apparent to one skilled in the art that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the components and engines may be implemented in firmware or hardware.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A system, comprising:
   a plug-in energy sensor, including:
      an antenna;
      an electrical prong insertable into an electrical outlet at a premises;
      a communication component;
      a first processor; and
      a first memory coupled to the first processor and storing first program instructions that, when executed by the first processor cause the first processor to at least:
         process a voltage data received via the electrical prong;
         detect a first change in a voltage represented by the voltage data;
         generate a voltage signature data representative of the first change in the voltage over a period of time;
         process a radiated electromagnetic energy data received via the antenna;
         detect a second change in a radiated electromagnetic energy represented by the radiated electromagnetic energy data;
         generate a radiated electromagnetic energy signature data representative of the second change in the radiated electromagnetic energy over the period of time;
         generate a signature data pair representative of the voltage signature data and the radiated electromagnetic energy signature data; and
         send, via the communication component, at least the signature data pair; and
   a remote computing system, including:
      a second processor; and a second memory storing second program instructions that, when executed by the second processor cause the second processor to at least:
receive the signature data pair;
compare the signature data pair to a plurality of stored signature data pairs to determine a device type associated with the signature data pair, each of the stored signature data pairs representative of a known voltage signature and known radiated electromagnetic energy signature for the device type of a plurality of devices; and
send a device type notification indicating an operation of the device during the period of time, the device type notification corresponding to the determined device type.

2. The system of claim 1, wherein the first program instructions, that when executed by the first processor to detect the second change in the radiated electromagnetic energy, further include instructions that when executed by the first processor further cause the first processor to at least:
compare a first portion of the radiated electromagnetic energy data with a second portion of the radiated electromagnetic energy data to determine the second change in the radiated electromagnetic energy data.

3. The system of claim 1, wherein the voltage signature data and the radiated electromagnetic energy data represented by the signature data pair correspond to a same time segment.

4. The system of claim 1, wherein the second program instructions, when executed by the second processor further cause the second processor to at least:
cause an action to be performed with respect to at least one of the device type or the premises.

5. A method, comprising:
measuring, with a plug-in energy sensor, a radiated electromagnetic energy present at a premises;
determining, with the plug-in energy sensor and based on information collected by the plug-in energy sensor, a change in the radiated electromagnetic energy at a start time, the change being between a first value of the radiated electromagnetic energy prior to the start time and a second value of the radiated electromagnetic energy at the start time;
in response to determining the change, storing radiated electromagnetic energy data representative of the change until a stop time at which the change is no longer detected by the plug-in energy sensor;
generating a radiated electromagnetic energy signature data from the stored radiated electromagnetic energy data; and
determining, based at least in part on the radiated electromagnetic energy signature data, at least one of a device type, a device, a device element of the device, or an operational state of the device.

6. The method of claim 5, wherein generating the radiated electromagnetic energy signature data includes:
generating radiated electromagnetic energy signature data representative of a change in radiated electromagnetic energy caused in response to operating the device in a device state between the start time and the stop time.

7. The method of claim 5, further comprising:
determining, with the plug-in energy sensor and between the start time and the stop time, a voltage data present on an electrical circuit at the premises.

8. The method of claim 5, wherein determining the device, the device type, the device element of the device, or the operational state of the device, further includes:

providing the radiated electromagnetic energy signature data to a machine learning model; and
receiving, from the machine learning model, an indication of the device, the device type, the device element of the device, or the operational state of the device that caused the radiated electromagnetic energy signature data.

9. The method of claim 8, wherein the radiated electromagnetic energy signature data is a representative of at least one of an operation of the device, a state of operation of the device, or the device element of the device.

10. The method of claim 8, wherein determining the device type includes:
analyzing the radiated electromagnetic energy signature data with a stored radiated electromagnetic energy signature data, the stored radiated electromagnetic energy signature data representative of a radiated electromagnetic energy signature caused by the device type.

11. The method of claim 10, further comprising:
subsequent to determining the device type, further comparing the radiated electromagnetic energy signature data with a second stored radiated electromagnetic energy signature data, the second stored radiated electromagnetic energy signature data representative of at least one of: a device of the device type, a device element of the device, or a device state of a device of the device type.

12. The method of claim 11, further comprising:
associating at least one of the device type, the device, the device element of the device, or the device state with the premises; and
updating a premises profile maintained in a data store based at least in part on the device type, the device, the device element of the device, or the device state.

13. The method of claim 5, further comprising:
measuring an intensity of the radiated electromagnetic energy signature data; and
determining, based at least in part on the intensity, an approximate position of the device at the premises that caused the change in the radiated electromagnetic energy at the premises.

14. The method of claim 5, further comprising:
providing the radiated electromagnetic energy signature data to a machine learning system; and
receiving from the machine learning system, an indication of the device type that caused the change in the radiated electromagnetic energy represented by the radiated electromagnetic energy signature data.

15. An apparatus, comprising:
a housing;
an antenna that receives radiated electromagnetic energy present at a premises;
at least one analog-to-digital converter that converts the radiated electromagnetic energy to radiated electromagnetic energy data;
at least one processor; and
a memory coupled to the at least one processor, the memory storing program instructions that when executed by the at least one processor cause the at least one processor to at least:
determine a radiated electromagnetic energy signature data represented in the radiated electromagnetic energy data, the radiated electromagnetic energy signature data corresponding to an operational device state of a device; and
determine, based at least in part on the radiated electromagnetic energy signature data, a start time corresponding to the radiated electromagnetic energy signature data and a stop time corresponding to the radiated electromagnetic energy signature data, wherein the device is operating in the operational device state between the start time and the stop time.

16. The apparatus of claim 15, wherein the program instructions that when executed by the at least one processor further cause the at least one processor to at least:
   determine a voltage signature data corresponding to the operational device data based at least in part on a voltage present on an electrical circuit at the premises.

17. The apparatus of claim 16, wherein the program instructions that when executed by the at least one processor further cause the at least one processor to at least:
   generate a signature data pair representative of the voltage signature data and the radiated electromagnetic energy signature data;
   compare the signature data pair with stored signature data pairs representative of the device at the premises; and
   determine, based at least in part on the comparison, that the device is operating in a first state at the premises.

18. The apparatus of claim 17, wherein the apparatus is further operable to utilize the electrical circuit at the premises as a second antenna.

19. The apparatus of claim 15, wherein the program instructions that when executed by the at least one processor to determine the radiated electromagnetic energy signature data further include instructions that, when executed by the at least one processor, further cause the at least one processor to at least:
   compare a first time window that includes a first radiated electromagnetic energy data with a second time window that includes a second radiated electromagnetic energy data to determine a change between the first radiated electromagnetic energy data and the second radiated electromagnetic energy data, the change indicative of the radiated electromagnetic energy signature data.

20. The apparatus of claim 15, wherein the program instructions that when executed by the at least one processor further include instructions that cause the at least one processor to at least:
   send the radiated electromagnetic energy signature data to a machine learning system for processing by the machine learning system to identify a device type that caused the radiated electromagnetic energy signature data.

21. A computer-implemented method, comprising:
   determining a radiated electromagnetic energy signature data represented in a radiated electromagnetic energy at a premises;
   determining, based at least in part on the radiated electromagnetic energy signature data, at least one of a device type, a device, a device element of the device, or an operational state of the device; and
   determining, between a start time corresponding to the electromagnetic energy signature data and a stop time corresponding to the electromagnetic energy signature data, a voltage present on an electrical circuit at the premises.

22. The computer-implemented method of claim 21, further comprising:
   converting the radiated electromagnetic energy present at the premises to a radiated electromagnetic energy data; and
   wherein the radiated electromagnetic energy signature data is determined, at least in part, from the radiated electromagnetic energy data.

\* \* \* \* \*